United States Patent [19]

Bitzinger et al.

[11] Patent Number: 4,912,698
[45] Date of Patent: Mar. 27, 1990

[54] MULTI-PROCESSOR CENTRAL CONTROL UNIT OF A TELEPHONE EXCHANGE SYSTEM AND ITS OPERATION

[75] Inventors: Rudolf Bitzinger, Munich; Walter Engl, Feldkirchen-W.; Siegfried Humml; Klaus Schreier, both of Penzberg, all of Fed. Rep. of Germany

[73] Assignee: Siemens Aktiengesellschaft, Berlin and Munich, Fed. Rep. of Germany

[21] Appl. No.: 206,960

[22] Filed: Jun. 13, 1988

Related U.S. Application Data

[63] Continuation of Ser. No. 37,087, Apr. 10, 1987, abandoned, which is a continuation of Ser. No. 651,954, Sep. 19, 1984, abandoned.

[30] Foreign Application Priority Data

| Sep. 26, 1983 [DE] | Fed. Rep. of Germany | .... 3334765 |
| Sep. 26, 1983 [DE] | Fed. Rep. of Germany | .... 3334766 |
| Sep. 26, 1983 [DE] | Fed. Rep. of Germany | .... 3334773 |
| Sep. 26, 1983 [DE] | Fed. Rep. of Germany | .... 3334792 |
| Sep. 26, 1983 [DE] | Fed. Rep. of Germany | .... 3334796 |
| Sep. 26, 1983 [DE] | Fed. Rep. of Germany | .... 3334797 |

[51] Int. Cl.$^4$ .......................... G06F 11/10; H04J 3/14; H04Q 1/22; H04Q 3/42
[52] U.S. Cl. ..................................... 370/13; 371/10.1; 371/68.1; 379/269; 379/279
[58] Field of Search .................... 379/279, 290, 10, 15, 379/269, 284; 370/13; 371/68, 10

[56] References Cited

U.S. PATENT DOCUMENTS

| 3,882,455 | 5/1975 | Heck et al. | 371/68 X |
| 4,245,344 | 1/1981 | Richter | 371/68 |
| 4,366,535 | 12/1982 | Cedolin et al. | 364/200 |
| 4,371,754 | 2/1983 | De et al. | 371/9 |
| 4,466,098 | 8/1984 | Southard | 371/9 |

OTHER PUBLICATIONS

"DMS-10 System Organization", L. Rushing et al., *Telests* (Canada), Aug. 1978, pp. 303-308.
"No. 10A Remote Switching System: Control-Complex Architecture and Circuit Design", R. K. Nichols et al., *Bell Sys. Tech. J.*, vol. 61, No. 4, Apr. 1982, pp. 419-450.
"Common Control Design Using Matched Microprocessors for Failure Detection", J. Holden, *GTE Auto. Elec. J.*, Sep.-Oct. 1982, pp. 118-121.
Niwa et al., "Multiprocessor . . . Switching System", Rev. Elec. Comm. Lab., 1982, vol. 30, No. 5, pp. 792-801.
Ward, M., "An Enhanced Processor for System X", ISS '81, Sep., 1981, pp. 1-7.
Hori et al., "Fault Detection . . . Switching System", (List continued on next page.)

*Primary Examiner*—Thomas W. Brown
*Attorney, Agent, or Firm*—Hill, Van Santen, Steadman & Simpson

[57] ABSTRACT

A method and apparatus for operating a multiprocessor control computer provides that at least one part of the central processors may be connected through switches to each half of a duplicated central bus system and through switches to each half of duplicated memory banks of a common memory. With the duplication and selectable switching, the multiprocessor control computer may be normally operated while the remainder of the computer may be connected to a special computer for modification of the normal operating program. Data already in one memory bank can also be stored in another memory bank under the same address so that after the special operating time of both memory banks, the memory banks contain the same information at the same addresses. Two specific processors are provided for operating and security functions, while the remainder of the processors carry out exchange functions. One processor controls and is loaded only to a predetermined percentage of its computing capacity while the other always holds open at least that predetermined percent of computing capacity in case it must take over the control function.

13 Claims, 5 Drawing Sheets

OTHER PUBLICATIONS

IEEE 81, pp. A6.1.1–A6.1.5, NTC '81, New Orleans.
Peterson et al., "Two Chips . . . Repair Itself", Electronics, Apr. 7, 1983, pp. 159–164.
Somoza et al., "Dynamic Processor . . . Switching Systems", Electrical Communication, vol. 55, No. 1, 1980, pp. 37–45.
Botsch, D., "The EWSD System", Telcom Report, 1981, (Special Issue), pp. 7–12.
Aseo, J., "Approaches Differ for Fault-Tolerant Systems", Computer Design, Sep. 1983, pp. 40, 42, 44, 46.
Cohen, K. I., "Multiprocessor . . . Processing", Electronics, Jan. 27, 1983, pp. 94–97.
Hendrie, G., "A Hardware . . . Indulates Programs", Electronics, Jan. 27, 1983, pp. 103–105.
Kraft et al., "Microprogrammed . . . Small Computers", pp. 197–206, Prentice-Hall, Inc., Englewood Cliff, New Jersey (undated).
Puccini et al., "Architecture of GTD-5 Eax Digital Family", IEEE, 1980, pp. 18.2.1–18.2.8, ICC '80, Seattle.

MULTI-PROCESSOR CENTRAL CONTROL UNIT OF A TELEPHONE EXCHANGE SYSTEM AND ITS OPERATION

CROSS-REFERENCE TO RELATED APPLICATIONS

This is a continuation of application Ser. No. 037,087, filed Apr. 10, 1987, now abandoned, which is a continuation of application Ser. No. 651,954, filed Sept. 19, 1984, now abandoned.

BACKGROUND OF THE INVENTION

1. Field of the Invention

The present invention relates to an improvement of a known multiprocesser control computer operating processes, which control computer has been described in, for example, the REV. of the Electr. Comm. Lab. 30 (1982) September, No. 5, Tokyo, pp. 792-801, fully incorporated herein by this reference and generally illustrated in the first figure of that publication. The invention is, above all, suitable for a central control unit of a particularly large exchange system, for example, one for telephones, telegraphs, picture phones, etc., in which a great number of technical exchange functions, such as, for example, the monitoring of all customers for the lifting of receivers and dialing, route searching, route switching, signal tones, call metering, announcements, and services of the most varied variety, etc., must frequently be carried out simultaneously or quasi-simultaneously.

2. Description of the Prior Art

Such a control computer must often have an extremely high processing capacity and an extremely great availability. For example, all complete disruptions of the telephone exchange system, operated without interruption, and controlled by the central control unit must be, if possible, shorter than 1 minute per year. In the event of smaller, local disruptions, the central control unit must continue to operate reliably and, to the greatest extent possible, must be self-correctable. Both high processing capacity and high availability, as well as the highest reliability of such central control units, and economics with respect to hardware, are acknowledged tasks.

Control computers, as well as central control units of exchange systems, which are formed of a number of central processors (with or without a local memory bank), which have the help of a bus system common to all central processors, have long been under discussion, have been developed in various ways, and, at least in part, have been at least experimentally realized. There is, accordingly, an abundance of literature references which can be helpful in evaluating both the invention and execution. These are:

British patent specification No. 1,243,464 which is the equivalent of the German published application 20 01 832;

ISS 81 CIC Montreal, Sept. 21-25, 1981, Section 21, pp. 1-7; National Telecommunication Conference 1, New Orleans, Nov. 29, 1981 to Dec. 3, 1981, Section A6.1.1.-A6.1.5;

U.S. Pat. No. 4,363,094;

British patent specification No. 1,457,030, corresponding to the German published application 24 24 828;

U.S. Pat. No. 4,413,327;

Computer Design, Sept. 1983, 40+42+44; Electronics, Jan. 27, 1983, pp. 94-97; Bell System Technical Journal, Volume 43, No. 5, Sept. 1964, Part 1, pp. 1961-1975; Electronics, Apr. 7, 1983, pp. 159-164; Kraft et al., Microprocessor Control and Related Design of Small Computers, Prentice-Hall, 1981, pp. 197-206;

U.S. Pat. No. 4,032,899+4,212,057+4,363,094;

GB No. 1,487,501+2,015,302

Electronics, Jan. 27, 1983, pp. 103-105; Siemens, Electronic Selection Systems, EWS, Central Controls Factory with SSP 102 and Operating Position, December 1978, pp. 8, 14, 44, 62, 63, 99, 101, 102 and 115;

International Conference on Communications 1, June 8-12, 1980, Seattle, Sections 18.2.1-18.2.8; Electrical Communications, Vol. 55, No. 1, 1980, pp. 37-45;

U.S. Pat. No. 4,020,459; British patent specification No. 2,070,391 which corresponds to the German published application 31 04 927;

British patent specification No. 2,086,104 which corresponds to the German published application No. 31 37 046;

Siemens, Telcom Report, 1981, Vol 4, Supplement on "Digital Exchange System EWSD", as an example particularly of the function of peripheral units, such as "order maintenance";

U.S. Pat. No. 4,337,843;

German published application No. 332/8 405, particularly the figures, as an example of one of the many possible bus systems; and German published application No. 33 19 710, particularly the drawings, as an example of an error detection circuit and safeguarding of storage of data, all of which publications are fully incorporated herein by this reference.

Bus systems, which permit a selectable distribution of tasks among the various processors, especially by means of arbiters, are known in many variations. Among these are also bus systems which are extraordinarily comfortable, versatile, and exceptionally secure, which have extremely great availability. In this regard, compare, for example, the above-mentioned German published application No. 33 28 405.

Central control units of exchange systems must, in addition to the technical exchange functions, also carry out further functions, particularly further technical operating and security functions. Among these technical operating functions are assignment and reassignment of phone numbers to customer connections, control of the cooperation of the various devices of the exchange system in a general manner not relating to the individual connection, such as changes in rates, memory development and the expansions of address space connected with the latter, further development of the exchange network and customer connections, installation of services not previously provided, changes in traffic routing and short cuts, the introduction of picture phones, automatic partial disconnection and the progressive reconnection after disruptions of service, and changes in load distribution. With technical security functions, it is particularly a matter of routine and/or error searches or error encirclement functions set off by alarms, which are hierarchically ranked extremely closely among one another, corresponding to the very complex error search processes in very large exchange systems of, for example, 50,000 customer connections within the territory of a single local telephone exchange.

It is, furthermore, known to continuously monitor and register, in the most varied manner, the load and freedom from error of the operation of processors, particularly of the processor being considered, while temporally compartmentalized, must carry out several different programs in a quasi-simultaneous manner.

Processes for operating circuits, among which are also memory banks, which, for reasons of security, have been duplicated and are operated in parallel, and which are read and addressed by one or several processors, are familiar to those of ordinary skill in the art. For example, the document cited above, Electronics, Jan. 27, 1983, pp. 103-105 should be considered in this context. Such processors and computers, which either have no local memories or which do have their own local memories, are generally connected, with a pair of memory banks or with many such pairs of memory banks, to a bus system which is common thereto.

The multiprocessor central control unit of an exchange system, for example a telephone exchange system having a bus system common to several processors, to which the central -common memory of the central control unit is connected, can also be used for a particularly large (telephone) exchange system, in which the individual processing steps necessary for a connection are very short, often only a few cycles long, but in which, however, a great number of technical exchange functions must frequently be simultaneously or quasi-simultaneously carried out for the numerous other simultaneous connections. The length of engagement of the common memory by one of the different processors must therefore be particularly short, which is a task which is considered in the known multiprocessor central control units.

SUMMARY OF THE INVENTION

The present invention has different general objects or tasks, whereby a portion of these aspects includes several other further developments, and whereby all of these aspects and their corresponding techniques were developed particularly for the type of central control unit of a telephone exchange system which includes all of these aspects and which are described herein, and which are particularly suited for this type of system.

It is one object of the invention to provide a further development of a multiprocessor control computer operating processes and having many central processors working in parallel, and which processes are frequently heavily loaded, and which processors are, perhaps, concerned with the most diverse of special tasks, which, without impairing normal operation and without impairing availability and reliability, make a separate part of the control computer available as a thoroughly independent, self-operating special computer. The special computer thus separated can, for example, also be used to prepare and so modify the normal control program of the control computer during normal operation of the control computer that the control computer can later carry out a modified normal operation.

It is a further object of the invention is provide an operating process for a pair of memory banks normally operated in parallel, so that:

The time expenditure for the termination of the operation of the second bank which was first disrupted earlier, namely for the realization of the information which is stored in the second bank which is to be again connected, is as modest as at all possible; and the realization can be carried out during the operation of the processors and of the first bank, automatically and without impeding operation of the first bank.

It is a further object of the present invention to provide a multiprocessor central control unit of an exchange system with many central processors or computers which operate in parallel, which are frequently heavily loaded, and which are occupied with the most diverse tasks, and in which the expense for hardware is modest. The technical operating functions should particularly remain assured, with a very high reliability and availability.

Further developments of the invention additionally permit:

The capacities of the central processors to be optically utilized, even if each central processor must complete the most diverse technical exchange tasks which are from time-to-time assigned thereto;

The distribution of the technical exchange tasks to be carried out on the central processors, with slight expense, and so rapidly, that 100% loading of most of the central processors or computers occurs relatively rarely;

The storage of identical information to be strictly confined to processor-specific memories, so that the entire memory capacity of the common memory and of the processor-specific memory, taken together, is less than if only processor-specific memories were applied, so that a quasi-simultaneous access of several central processors to the common memory is nonetheless made possible; and During the quasi-simultaneous cooperation of various central processors with the common memories, particularly short access times are made possible.

It is a further object of the invention to so develop the multiprocessor computer having central processors which are simultaneously occupied with the most varied tasks, and which correspondingly simultaneously carry out different processes, particularly with each central processor having another instantaneous processing, insofar as this does not entail a delay, so that:

On the one hand, the expense for hardware is modest; and

On the other hand, the time expenditure for access by a central processor to the common memory is as slight as possible, and a quasi-simultaneous access is made possible, in which several central processors can gain access, by way of a single bus system, and without mutual interference, to a common memory.

Further developments of the present invention provide or permit:

The construction and operation of the multi-processor computer to be made particularly simple; and The intensification of the flow of addresses and information to the bus system, and thereby the attainment of a particularly high processing capacity by the multiprocessor computer.

A further object of the invention concerns a special testing device for detecting errors in duplicated circuits, in, for example, the duplicated processors of a telephone exchange system. This aspect of the invention was developed, in particular, for controlling the disconnection of a pair of central processors affected by error, and for substitution of another central processor pair in a multiprocessor central control of a telephone exchange system, in accordance with the remaining citations set forth above. This special further object of the invention is, however, also suited for other duplicated circuits, which are additionally secured in accordance with an error detection and correction code (EDC code). This further special object of the invention is to so develop a test device operating in accordance with the EDC code that:

On the one hand, hardware expense is modest; and Yet, on the other hand, the security and reliability of the error recognition is very high.

A further development of the invention additionally permits:

An error-afflicted central processor pair to be easily disconnected from the bus system, with slight expense in comparison to the reliability achieved.

A further object of the invention is the improvement of a multiprocessor central control unit having a central bus system, to which the central processors, as well as the common memory, are connected, so that the central processors are simultaneously occupied with the most diverse special tasks, and simultaneously carry out different processes, whereby, for example, each processor carries out a different instantaneous processing, as long as the same does not cause a delay, and to specifically so improve such a multiprocessor central control unit that:

On the one hand, the expense of hardware is modest;

On the other hand, the length of engagement of the common memory by the access of a central processor to the common memory is as brief as possible; and During the failure of an individual central processor, generally no connection, or only a directly processed connection, is disrupted, so that the disruption is very slight, apart from possible special cases in which a central processor working on several connections, for example, directly alters generally valid data in the common memory.

BRIEF DESCRIPTION OF THE DRAWINGS

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
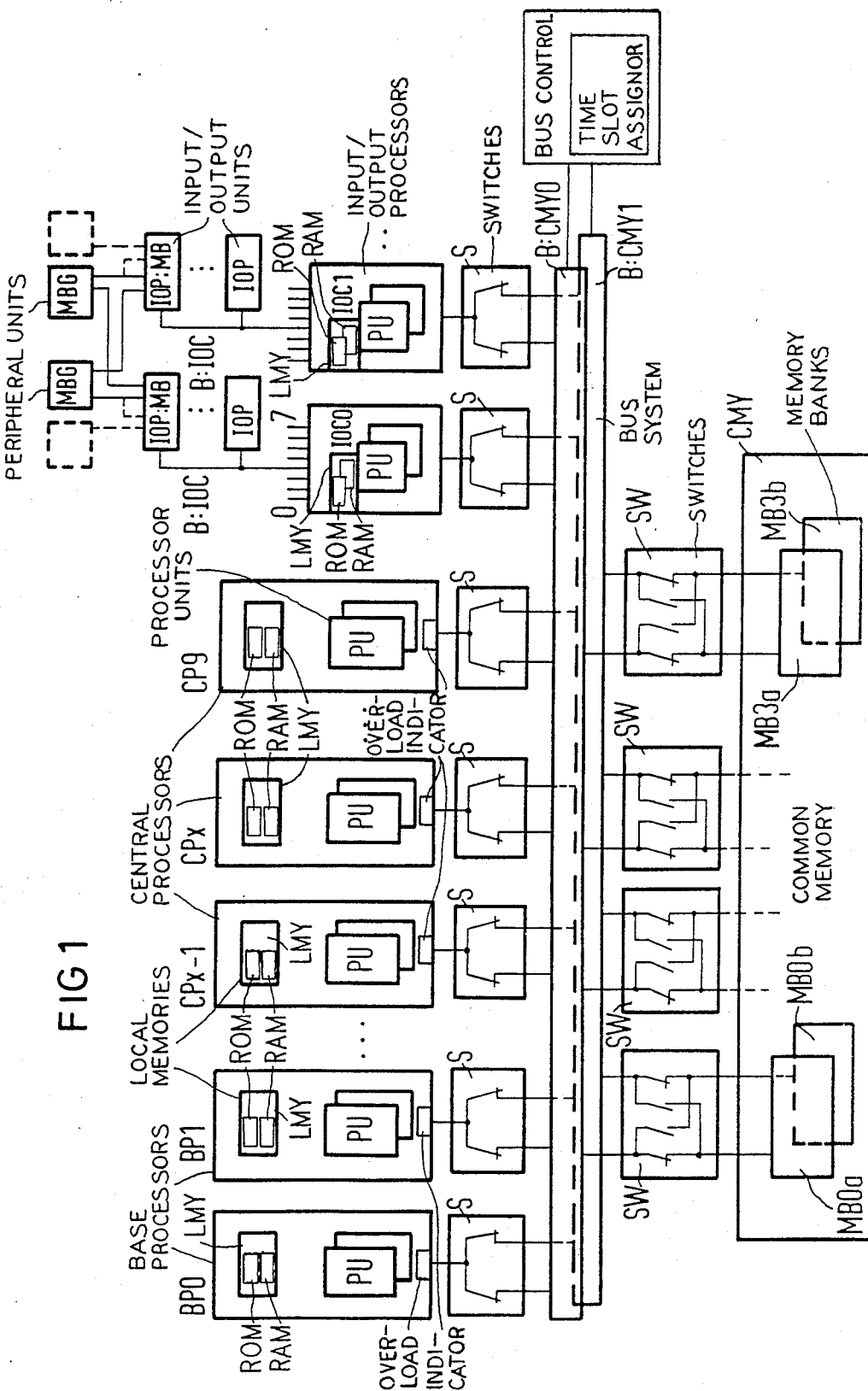
FIG. 1 is a schematic representation of an exemplary embodiment of a central control unit constructed and operating in accordance with the present invention.

First of all, reference should now be made to the solution of at least the task first stated, namely, of so developing a multiprocessor control computer, operating processes, and having many central processors operating in parallel, which are frequently heavily loaded, and which are perhaps occupied by the most diverse special tasks, that, without impairing normal operation and without impairing their availability and reliability, a separate part of the control computer is available as a thoroughly independent, self-operating special computer; whereby the special computer can, for example, be used during normal operation of the control computer to preparatorily so modify the normal control program of the control computer, so that, later on, the control computer can execute a modified normal operation; first of all, however, the construction of the example depicted in FIG. 1 will be discussed in greater detail.

FIG. 1, simplified for the sake of clarity, depicts a central control unit of a telephone exchange system having a plurality of central processors BP, CP, IOC, IOP, and having a duplicated bus system B:CMY and duplicated memory banks MB of a common memory CMY. Each half of the bus system B:CMY, as well as each half of the memory bank pair MB can, as desired, be connected by way of plurality of switches S, SW with each processor BP, CP, IOC, IOP, as desired.

FIG. 1 shows al of the particularly important pairs of an exchange system central control unit, in which the two so-called base processors BP0, BP1, as well as the 10 additional central processors CP0 ... CP9 are connected to the bus system B:CMY. For reasons of security, the bus system is duplicated, as illustrated with the individual bus systems B:CMY0, B:CMY1. Each central processor contains, in addition to the specific processor unit PU, which is duplicated for security purposes, a processor-specific local memory LMY, as well as the usual additional components, such as cycle connection, enable connection, etc., and, preferably, at least one test device which operates in accordance with an EDC code. Also, the bus system B:CMY and the memory banks MB contain such test devices, which operate in accordance with an EDC code. Each such central processor is considered as a whole, duplicated again for security reasons, which is not illustrated in FIG. 1.

The central unit of an exchange system has, simultaneously, at least technical exchange, operating and security functions and tasks to be carried out. The central control unit of a particularly large exchange system must carry out a particularly great number of technical exchange functions, either simultaneously or quasi-simultaneously, such as, for example, monitoring customers for lifting receivers and dialing numbers, route searches, route switching, signal tones, call metering, announcements, facilities of the most varied type, etc. Among the technical operating functions are particularly the assignment and reassignment of telephone numbers to customer connections, control of the different devices of the exchange system in a general way not related to the individual connection, such as changes in rates, memory construction, and, in connection therewith, expansions of address space, further developments of the exchange network or customer connections, installation of facilities not previously provided, changes in alternate routing and short cuts, introduction of picture phones, automatic partial disconnection and gradual reconnections after disturbance of operations, changes of load distribution, etc. In the technical security functions, it is a matter, in particular, of routine and/or error searches or error encirclement functions tripped by an alarm, which are hierarchically finely ranked, corresponding to the very complex error search process in very large exchange systems of, for example, 50,000 customer connections within a single telephone exchange territory.

All active central processors BP, CP, IOC, preferably duplicated for reasons of security, and therefore actually forming a processor pair, which are in normal operation simultaneously carry out, if sufficient connection requirements are present, the technical exchange functions; that is to say, carry out functions for meeting instantaneous requirements which are placed on the exchange system by customers who are calling or being called.

Among the central processors and processing pairs which are preferably constructed essentially in connection with one another, both of the base processors and processor pairs BP carry out, during normal operating times, and preferably in common with distributed schedules, technical operating and/or security functions, as well as, during high traffic densities further possible technical exchange functions. The active central processors CP in normal operation preferably carry out, however, only technical exchange functions. The duplication of the base processors BP or processor pairs is favorable for reasons of security, since one error-free operating base processor is always available for the execution of these technical operating and/or security functions, especially, in the event of alarm, during the restarting of the exchange system after a partial or complete disconnection of the exchange system, with the cooperation of the switches S and SW. The technical operating and/or security functions should then be preferably not be left to any randomly-chosen central processor CP, since, especially in cases of extreme urgency, there is too frequently not enough time to first seek out an error-free processor CP among the central processors CP, especially to seek an error-free processor out in order to restart the exchange system.

In the example illustrated in FIG. 1, the common memory CMY connected to the bus system B:CMY is constructed of several, here four, memory banks MB0 . . . MB3, which are duplicated, so that at least some and possibly all, central processors BP, CP, IOC have access by way of the switches S through each half of the bus system B:CMY, and, furthermore, through the switches SW to all the data of each half of the common memory CMY. In this connection, compare the memory banks MB0a, MB0b . . . MB3a, MB3b, as far the justification of an access is not limited, for example, through restriction of the addresses. The switches S and SW therefore make possible at least one, specifically a random, half of the memory bank pair, for example, the memory bank MB3a, being connected by at least one, likewise random, half of the bus system, for example, the bus M:CMY1, with a specific central processor, according to free choice. All switches S have, correspondingly, two separately controllable switch sections, namely, one from the central processor to one half B:CMY1 of the bus system and one from the central processor to the other half B:CMY0 of the bus system, whereby both switch sections are optionally switched through, both switch distances are blocked, or only one of the switch sections are switched through. Diverging therefrom, all of the switches SW have four corresponding switch sections which can, as required, also be separately controlled, namely, so that the switches permit connection from each bus system half B:CMY0, B:CMY1 to each half of the memory bank pair, for example, to the memory bank pair MB3a, MB3b.

The separate switchability of all switch sections of the switches S and SW therefore permits the production of random paths for the flow of data via the parts of the central control unit, which are redundant through duplication, as well as interruption and new connection in event of need/alarm, especially during automatic restarting after total failure of the exchange system or of the central control unit. To the technician this means the progressive, automatic reconstruction of the central control computer after total failure is an operating process in exchange systems which is already well known in principle. These switches S and SW can serve, in normal operating times, to also switch the operation from one half of the parts duplicated to the redundant other half, also from the base processor BP0 to the base processor BP1, or, under full operation of both halves which belong together in the previous normal operating times, to switch off or cut off one of the two halves, for example, to disconnect the bus half B:CMY1 of the bus system and/or the other half MB3b of the memory pair MB3, in order to thereby continue the full normal operation, now alone with the other half. In this regard, compare the elements B:CMY0 and MB3a. The switches S and SW therefore also serve, in the example illustrated in FIG. 1, for the configuration of the specific central control computer construction, and the data flow belonging thereto, during the normal operating times.

FIG. 1 therefore illustrates an example of a highly-complex multiprocessor control computer, in which at least one portion of the processor, compare the elements BP, CP, IOC and indirectly IOP has excess by way of a first switch S and thereby through each half B:CMY0, B:CMY1 of a central bus system B:CMY, which is duplicated in itself, and a second switch SW, connected thereto, to each half, for example MB3a or MB3b, of one or several duplicated memory banks MB of the common memory CMY, which contains a plurality of such memory banks MB01 . . . MB03. This control computer, therefore, has abundant hardware redundancies, which guarantees, as thoroughly as possible, its great availability, even in event of failure of several essential individual components.

FIG. 1 further illustrates peripheral units MBG, for example, control units of coupling field sections which, in a known manner, operate directly or indirectly on the circuits of the exchange network, for example, in the scope of route searching, through switching, or circuit groups control, signaling, fee computation and the like. These peripheral units are likewise duplicated as illustrated in the cross connections between the two units MBG illustrated in FIG. 1. They have, in the examples illustrated, their own input/output units which preferably also contain their own, therefore decentralized, processor, as illustrated at the units IOP:MB. Such input/output units are connected to the local buses B:IOC as illustrated in the right-hand portion of FIG. 1, which are connected with further such peripheral units which, however, for the sake of clarity are not illustrated in FIG. 1.

The input/output units IOP:MB . . . IOP, or their local buses B:IOC are, in the example illustrated, additionally connected with the bus system B:CMY, by way of four central input/output processors IOC of which only two IOC0, IOC1 are fully illustrated. It is shown in FIG. 1 that further such central input/output processors IOC can be provided in very large exchange systems. The input/output processors IOC can control the data flow from and to the peripheral units (IOP/MBG), via the bus system B:CMY, to and from the common memory CMY, or to and from the central processors BP, CP. The peripheral units, as illustrated at MBG, can also be connected with the common memory, or, if needed, only with the individual units of the memory-banks MB, and/or possibly can also be connected with various of the central processors BP, CP, and from time-to-time differentially distributed. Through these connections, communications and/or requests from the peripheral units MBG and communications and/or requests to such peripheral units can be carried out. The technical exchange communications and/or requests of a peripheral unit MBG are thereby distributed per call, preferably autonomously, via the input/output unit or input/output control IOC connected thereto. For example, the specific input/output unit IOP, if it receives the call from the peripheral unit MBG, assigns, or via the bus system B:CMY, has assigned, one of the central processors CP, BP or one part of the common memory CMY/MB, to this peripheral unit which is calling. The selection or distribution of the central processors BP, CP for the execution of the functions, especially those which are triggered by a call of a peripheral unit MBG can always, for example, occur cyclically, so that, under overloading of a central processor CP this processor is skipped over in the cyclical selection process. Through such a cyclical distribution of the tasks or calls to the processors concerned, a high degree of uniform loading of the central processors can quickly be attained. In general, all central processors quickly exhibit at least a certain partial load. An error, or the tendency to error-affected processing, can be quickly found in the central processors, so that the erroneous central processor BP, CP under consideration is temporarily put out of operation by way of technical operating functions, which preferably are carried out by one of the base central processors BP, and can be skipped over during cyclical distribution, so that a, possibly partial, self-healing of the central control unit, for example through the substitution of circuits and saving of memory contents, can also be carried out.

The assignment of a special central processor, and/or a special part of the common memory CMY/MB, to the two peripheral units MBG illustrated in FIG. 1 (for example, 1 connection engaged, two peripheral units MBG) can be stored in a special data field, so that this data can be applied within a memory bank of the common memory. Through the storage in the data field, all later communications or requests can be transmitted to the relevant peripheral units MBG, preferably to the same central processor BP, CP previously assigned, or to the same common memory banks MB, especially with the cooperation of the specific relevant input/output units IOP of the relevant peripheral units MBG, in order that the technical exchange functions, which are released by the call, can be continued there. Also in this case, the autonomous assignment per call cakes possible an approximate even loading of all central processors CP and/or BP with technical exchange functions, at least, this assignment can be so controlled correspondingly to the instantaneous charging of the central processors BP, CP that the communications and/or requests of a technical exchange type following the call can genuinely be carried out quickly by one of the central processors, which still has sufficient free capacity.

As illustrated in FIG. 1, the central common memory CM1 or its memory banks MB are connected to the bus system B:CMY. At least a majority of the central processors BP, CP, IOC, if not all of the central processors BP, CP, IOC, can have access to the common memory CMY or to the individual portions of its memory banks MB, for example, quasi-simultaneously through the time slots or time channels assigned thereto by a time slot assignor in accordance with the time-division multiplex principle. Through the time-division multiplex operating method of the bus system B:CMY, longer communications must not be expected between the common memory CMY and random central processors CP, BP, until another central processor can, for its part, finally have access to data from the common memory CMY, or can deposit data in the common memory CMY. This time-division multiplex operating method is, in view of the many central processors BP, CP, IOC operating in parallel at the same time and concerned with different tasks, accordingly very advantageous to the shortening of the access time to the common memory CMY. It is particularly advantageous if the common memory has a large number of memory controls or decoders operating independently of one another, so that an individual such memory control can temporarily be assigned individually to one of the central processors CP, BP, IOC. this is therefore particularly the case if the common memory comprises a plurality of memory bank pairs operating in parallel, through quasi-simultaneous access to a memory bank MB of the common memory CMY, time slots or time channels can be individually and fixedly assigned to the bus system B:CMY, individually to the memory banks MB, or individually to the memory bank pairs MBa, MBb.

The construction of the individual devices of the central control unit, for example, the central processors BP, CP, the memory banks MB, the common memory CMY, or the central input/output processors IOC, which, for example, also have a different number of local system buses B:IOC (compare the outputs 0 . . . 7) of the input/output processor IOC0, can be favorable in and of itself. They must fit only to the selected system bus B:CMY, or be adjusted to its method of construction or operation.

The codes and local data dynamically important for running can, for the purpose of reducing the access to the common memory CMY, be stored in a random access memory (RAM) which forms a portion of the local, processor-specific memory LMY. Also, large sections of the comprehensive control program of the central unit, for example, identical in all central processors CP, can be stored in a read only memory (ROM) section of the local, relatively large memory LMY; for example, start and error recognition programs, in order, in case of need, to increase the starting and diagnostic speed of these processors, as well as to increase the availability of the central control unit through rapid complete replaceability of each of these central processors which are loaded identically, by way of switching to another of the central processors. The individual central processors BP, CP can therefore, in principle, represent thoroughly autonomous computers with at least substantially the same construction, completely identical, and with tasks or schedules distributed per call; more specifically, computers which operate, in different cases, with peripheral elements by way of the bus system B:CMY preferably by way of the common memory.

The peripheral units can also represent technical elements, such as, for example, signal generators, coupling field elements such as circuit group control, etc., as well as also representing technical exchange sub-units for partial functions of peripheral devices, which carry out a larger complex of different functions. It generally suffices to connect these devices to the central input-/output processors IOC, by way of unduplicated, and therefore simple, available input/output units (compare IOP:MB . . . IOP), if the peripheral devices (compare MBG), contain cross connections as illustrated in FIG. 1. These input/output processors IOP and/or the relevant central input/output processors IOC can have additional special test functions, in order to render difficult access attempts based on errors to the central processors BP, CP and to the common memory CMY.

In an example in accordance with FIG. 1, Siemens AG SAB 80286 microprocessors were used for the central processors BP, CP, which processors have at their disposal a physical address space of 16 MBytes. A total of 12 such processors were applied, each having 2 MByte local memories LMY. All central processors BP, CP, IOC and thus not just the base processors BP were duplicated for the improvement of error recognition and could only be disconnected in pairs. The relevant processor pairs operated synchronously, and were checked in accordance with an EDC code. During writing cycles, the signals were always emitted by the preferred processor of each pair; while, during the reading cycle, both processors of the pair were maintained if the differentiation between local, processor, specific memories LMY and the common memory was carried out via the address. For the individual central processor, that is, the addresses engaged for the local processor, specific memory LMY could not be directly reachedd in the common memory CMY for the central processor (or, during duplication, for this pair of processors). The communication between the central processors BP and/or CP and/or IOC occurred via the bus system B:CMY and the memory banks MB by setting priorities. The units of the central input/output processor IOC duplicated for security reasons, with the pertinent local bus B:IOC and the input/output unit IOP as a rule distributed the load obtained. The data exchange between the input/output units IOP and the central processors BP, CP occurred in the example cited via the common memory CMY/MB, so that, for example, 8086-type components may be used for the central processors IOC.

The local buses B:IOC were operated in accordance with the time-division multiplex technique, that is, with cycle compartmentalization, which considerably increases the throughput of the buses, since a second cycle can be encountered also there, before a first cycle is terminated.

In the purely normal operation, without a special operation, both halves of the bus system B:CMY generally operated in parallel and processed identical information, as long as neither of the halves B:CMY0, B:CMY1 failed. The bus system B:CMY operated in accordance with a multiplex process, preferably with four time slots, which, with the use of 12 central processors BP, CP suffice for a telephone exchange system for several tens of thousands of customers, at least at first. The memory banks MB0 . . . MB3, here only four such banks, were so arranged with the four time slots, that each time slot was firmly assigned to a memory bank or to a pair of memory banks. The arbitration was carried out before the assignment of a time slot to the central processors BP, CP, IOC, in order to increase the performance of the bus system.

Among the peripheral bus units, there are also O/M units (operations and maintenance), which were often previously used in the central control units. In this connection, compare, for example, the description of such central control units, especially of the type SSP112D in the aforementioned Siemens Telcom Report, 1981, Vol. 4, supplement "Digital Exchange System EWSD". In this document, the operation of other peripheral units is described in greater detail.

Greater detail can now be set forth with respect to the individual tasks or aspects and solutions for the present invention.

For the solution of the above, first-stated tasks of the invention, the switches S, SW can likewise be utilized.

In the multiprocessor control computer operated in accordance with the invention (with these hardware redundancies, which normally serve to secure against total failure in the event of failure of individual control computer parts), redundant computer parts can temporarily be separated from the computer by way of the switches S and SW so that the remainder of the computer continues in its normal operation. The separated parts form, for themselves, a complete, substantially independent second computer in accordance with the flow chart of FIG. 2. The disconnecting points, therefore, above all else, the switches S and SW, provided for normal operation, which are at any rate already provided for the failure of individual parts and which can be controlled, for example, through software and-/or through error-recognition monitoring circuits of the hardware, can preferably be used both to separate the partial computers and also later for the automatic reuniting of the partial computer to the normally-operating complete control computer. The different monitoring devices, which are mostly applied in control computers and which serve for starting and/or for alarm in the event of the failure of a part, can therefore co-control the separation of both the partial computers, as well as, above all, the automatic reconnection, thus the computer configuration, by way of the switches S and SW, without causing a total failure of the continuous normal operation.

The redundancies attained through duplication therefore serve, in normal operating times, only to increase availability, so that, during failure of individual parts, other redundant parts can be able to temporarily fully continue the normal operation, so that total failure and also attempts at automatic starting can be avoided in such failures by the individual parts. During normal operation, therefore, not all redundant parts are always required; monitoring devices, at the start and at the failure of a part, so control the switches S and SW that the switching to another, previously redundant half avoids the total failure of the central control unit.

Figure 2:
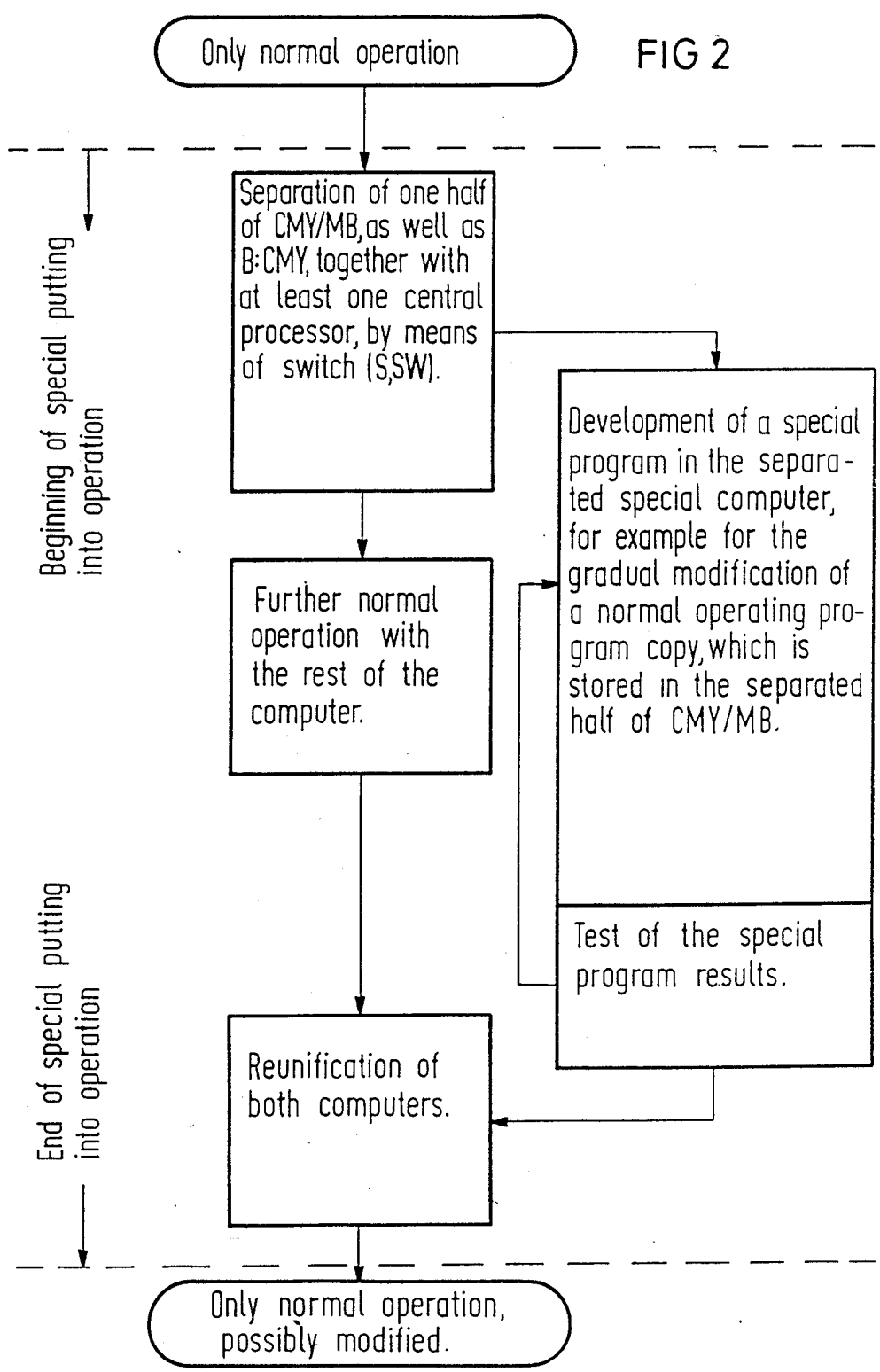
FIG. 2 is a flow chart depicting an operating sequence showing, as an example with respect to FIG. 1, how normal exchange functions can be carried out undisturbed, and how, despite a part of the central processors and memory banks, they can form their own independent additional computer, for example, for the preparation of a modified operation of the entire computer.

In order, therefore, at the beginning of a special operating time, to switch off the redundant parts of the control computer, and in order to interconnect the separated parts to an, at least relatively, small independent special computer, without disturbing the normal operation of the residual control computer during such special operating time, an individual or individuals of these special processors (for example, only the central processor CP9 and/or the central processor IOC1, with its input/output control IOP), together with a half (for example the half B:CMY1) of the bus system B:CMY, and together with one or with several halves of the memory bank pairs MB of the common memory CM (for example, with the memory banks MB0a, and MB3b) are interconnected to a special computer for a special program by way of the switches S and SW. The special program can therefore be selected, for example, to also serve for the preparation of a more or less thorough modification of the previous normal operating program of the control computer, as shown in FIG. 2. This special program, therefore, runs in the special computer, while the remaining portions of the control computer, and thus in the residual computer (processors BP, CP without CP9, and the processor IOC0 with its input/output control IOP, the bus half B:CMY0 and the remainder of the common memory CMY), the previous normal operating program runs, for example, for technical exchange functions. Later, upon completion of the special operating times, or at the latest upon the overload of the residual computer working with the normal program, and especially in the event of the failure of an essential portion of the residual computer, the special computer interrupts or ends its special program, since the components of the special computer, or at least an essential portion of its processors and/or at least its bus system halves, such as the half B:CMY1, are again so promptly connected, by way of the switches S and SW, to the residual computer, that only the normal operating program or, for example, a modification thereof which is newly administered in the special operating time, can run, without disturbance of the availability of the residual computer/control computer, as also illustrated in FIG. 2. In accordance with this aspect of the invention, it is a matter, therefore, of a special operating method of the control computer, in order to divide the same into two computers which, up to the configurative restrictions regarding the switching to redundant portions, can operate independently of one another. The residual computer further performs the normal operation; therefore, the exchange operation, while the separated special computer carries out, for example, no normal operation has, perhaps, access to the technical exchange peripheral units MBG, but stands available for data processing tasks, for example, for the exchange of the normal operation units program and/or for software tests, if only in a restricted manner. If, however, because of impending total failure of the same, an original starting condition appears in the residual computer during its normal operation, the original start preferably occurs for the entire control computer, including the special computer. The special computer should preferably start only as the consequence of a demand placed by a special action, preferably actuated by hand, and preferably undertake no automatic configurative expansions of its hardware. Since, also, during the operation of the entire central control unit as specified by the invention, an automatic start of the entire control computer with a loading process must also be taken into account, it is ensured, in a preferable variation, through corresponding previous identification of disks or memory banks of the special computer, that also during these loading processes, access can only be made to the correct data.

The beginning of the separation of the special computer is carried out, preferably through operational input with specification of the relatively extensive configuration of the special computer. The latter should, for example, be interconnected by a base processor such as the processor BP1 by a bus system half, for access to the common memory CMY, by a complete unit of memory banks, for example all "a" halves of all memory bank pairs MB0 . . . MB3, by an input/output processor IOC with its local bus B:IOC, and, for example, by a disc device to a systems disc, as well, perhaps, by its own operating device, for example for the input of the special program and the data which pertain thereto to be processed.

The separation, as specified by the present invention, for configuration of the special computer is then permitted in the example illustrated in FIG. 1, if these portions which are redundantly separated are actually still freely available and, preferably, if the input/output unit IOP:MB of the residual computer is actually in the "active" condition and can therefore actually at that time participate in an exchange. Several central processors CP can, as required, be assigned to the special computer, insofar as the efficiency of the residual computer, which is thereby reduced, is representable for its tasks.

Depending on the special tasks to be carried out, the special computer can also require a magnetic tape device and/or a rapid printer. These can, as needed, be assigned to a special computer, instead of the residual computer, and they can still be configured during the special operation time from the residual computer, and then be connected to the special computer. The operating personnel can therefore avoid intolerable conflicts.

The following cases of need can be distinguished within the scope of the special operation:
Production of the special computers;
Cancellation of the special computers;
Start in the residual computer; and
Start in the special computer.

In the production of the special computer, a new start is carried out by the same processor after it has been put out of operation, for example, a central processor BP and/or CP, or for example, after a short stoppage of the normal operation in the central processor, for example, by changing the technical exchange input/output by distributing the technical exchange tasks, etc. At least one of the base processors BP, for example the base processor BP0, with all operating devices remaining thereto, remains in the mediating (namely switching in a telephone exchange) residual computer. No further start actions occur in the mediating residual computer.

For example, the other base processor BP can, with the separated portions and operating devices assigned thereto, form the non-mediating special computer. Its being placed into operation occurs first, for example, with the loaded units program system, which can be stored in its local memory LMY or, for example, in a memory bank half. After the production of a start-capable configuration, the special computer is again put into operation with a new start, restart, or manual original start of the central processors BP, CP of the special computer. Since, in the special computer, all processes considered in the separated condition of the control computer, each disturbance of the mediating residual computer can be avoided.

The cancellation of the separated condition can be caused by the mediating computer. All portions and operating devices in the non-mediating special computer, preferably following setting into operation can again be gradually assigned to the mediating residual computer. The special computer processors are hereby processed like a single reserve processor being put into operation.

At the start in the mediating or control residual computer after separation and configuration of the system, all functions and steps of the start in the mediating residual computer are retained. The following additions are additionally valid, however, including failures and starts in the non-mediating special computer being ignored by the mediating residual computer. Furthermore, an automatic original start and the mediating residual computer releases the starting of the entire control computer, whereby the separated condition in both the computers is automatically canceled. During the original start, the central processors CP are preferably loaded entire anew.

At the start of the non-mediating special computer, the manual and automatic start functions and starting stages can preferably be restricted as follows:

An original start cannot be released by the special computer;

An original start of a central processor CP is preferably only manually possible with the operating devices of the non-mediating special computer, whereby reactions in the mediating residual computer are to be obstructed in all circumstances; and In all permitted start cases of the special computer, the separated condition of the control computer is always to be considered, in order for a disturbance of the mediating residual computer to be excluded.

The special operation is ended, at the latest, by a corresponding operating input, or by an original start condition after a hardware failure in the residual computer. This can occur, for example, in the following sequence:

The central processor of the special computer is reset, tested, and finally put into operation; There now follows a reorganization/expansion of the technical exchange input/output; and Then a manual setting into operation, if necessary, of the output of a protocol and the indication of the control computer condition on a system panel.

The solution of the task set forth above consists essentially in that, for the operation of a multiprocessor control computer, especially for the central control unit of a telephone exchange system:

At least one part of the processors BP, CP, IOC, IOP has selectable access through the first switches S and thereby through each half B:CMY0, B:CMY1 of a central, duplicated bus system B:CMY, and through the second switches SW;

To each half of the duplicated common memory CMY, and

To each half (for example MB3a and/or MB3b) of one or several duplicated memory banks MB of the common memory CMY which contains a plurality of such memory banks MB0 ... MB3.

It is provided that, in order to separate redundant portions of the control computer in a special operating time and to interconnect to its own independent special computer, without disturbing the normal operation of the residual control computer, Individual redundent units of these processors such as, for example, the processors CP9 and/or IOC1, together with a half, for example, the half B:CMY1 of the bus system B:CMY and together with one part of the common memory CMY with one or more halves of the memory banks MB of the common memory CMY, are interconnected to an independent special computer for a special program, for example, for the preparation of a new modification of the normal operating program of the control computer While, in the remaining parts of the control computer and therefore in the residua computers BP, CP without the processor CP9 and IOC0 with its control IOP, and the bus half B:CMY0, and the remainder of the common memory CMY, the previous normal operating program runs, for example, for technical exchange functions.

It is also provided that, in order to later, and at the latest, upon the overloading of the residual computer, especially in the event of the failure of an essential processor of the residual computer, end or interrupt the special program of the special computer, The components of the special computer, at least one essential part of its processors, and/or at least its bus system halves (B:CMY1), are again so connected with the residual computer that essentially only the normal operating program runs subsequently, or a modification thereof runs subsequently, newly administered in the special operating time.

A process for circuits, among which are also memory banks which, for security reasons, are duplicated, and which are operated in parallel, (for example read and write by way of one or several processors), is familiar to those of ordinary skill in the art, as is evidenced for example by the aforementioned article in the publication "Electronics", Jan. 27, 1983, pp. 103–105. In general, such processors or computers, which either have or do not have local memories of their own, together with the pairs of memory banks or with many such pairs of memory banks, are connected to a bus system common thereto.

One of the objects of the invention is to so develop an operating process for a memory bank pair normally operating in parallel, that:

The time expenditure for the completion of an operation of the second bank which seems to be or which is recognized to be storing defective or non-up-to-date informations and which therefore was disrupted first, namely, for updating the information which is stored in the second bank of this pair of memory banks, is as slight as possible; and This updating during operation of the processors and of the first bank of this pair of memory banks can be carried out automatically and without impeding the operation of the first memory bank.

The solution of this object consists essentially in that, in a process for operating a memory bank pair MB3a, MB3b operating in parallel during normal operating times, therefore, a first memory bank MB3a and a second memory bank MB3b have:

At least one processor BP, CP, IOC which, among the possibly coded addresses delivered thereto, reads during the normal operating time with the read/write operating information from both memory banks and/or records in both memory banks so that, during the normal operating time, the first of these memory banks stores the same information under one of its address as the second memory bank stores under the same address;

Microsynchronous comparison of the information read from both memory banks MB3a, MB3b during the normal operating time, and/or with continuous self-inspection of each memory bank MB3a, MB3b, for example, by way of an EDC code;

Separate disconnectability of both the first and second memory banks MB3a, MB3b for blocking access of the specific access-willing processor (for example a processor CPx) to the specific disconnected bank, here termed the second bank MB3b, in a special operating time, at least while reading from this second memory bank MB3b, so that the first memory bank MB3a alone is then occupied by the read operation so that the first memory bank MB3a alone can therefore also fully maintain the reading operation but that both the first and the second memory bank in common maintain the writing operation for a processor, for example the aforementioned processor CPx; and An address generator, for example, provided in the input/output control IOC1, which can, in the special operating time, produce all addresses systematically one after another, at least in stages.

For example, for a common memory CMY of a multiprocessor control unit of an exchange system, for example a telephone exchange system, which contains several such pairs of memory banks MB0 . . . MB3 it is provided that:

Before the end of the special operating time, therefore, before the transition to the normal operating time, for the updating of all informations to be stored in the second memory bank MB3b During the recording in the first memory bank MB3a, the same information is written in the second memory bank under the same address.

In the special operating time, for example, during one or several pauses of the read/write operation in which, for the reevaluation in the processor CP, IOC, neither the first memory bank MB3a is addressed for storage, nor is the first memory bank MB3a read by the processor or by the processors CP, IOC The address generator gradually delivers all addresses of the first and second memory banks MB3a, MB3b to those memory banks so that the information read from the memory bank MB3a is written under the same address in the second memory bank MB3b; and After the address generator has delivered all addresses and after all information is identical under all addresses in both memory banks MB3, the normal operating time begins or begins again, namely both of the memory banks MB3 are again operated in parallel.

Figure 4:
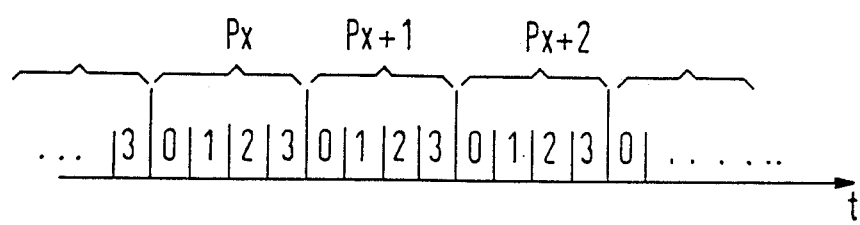
FIG. 4 is a timing illustrating how the time slots in the central bus system can be assigned to the individual, here four, pairs of memory banks.

The above object and its solution is illustrated in greater detail in the examples illustrated in FIGS. 1 and 4.

In this aspect of the invention, distinction is made between the normal operating time and the special operating time. During the normal operating time, both of the memory banks, for example the memory banks MB3a and MB3b of each pair of memory banks are operated in parallel, preferably microsynchronously so that here, in the common memory CMY, four such memory bank pairs MB0 . . . MB3 are provided, of which each pair can, for itself be controlled separately, simultaneously with the other three pairs. At least one of the central processors BP, CP, IOC reads among the addresses, possibly coded, which have been delivered thereto (in this normal operating time with the read/write operation), information from both banks of the pair of memory banks (for example MB3a, MB3b) or records information in both of these memory banks. In this normal operating time, if no interference is present, the first of the memory banks, for example the memory bank MB3a, subsequently stores the same information as the second memory bank MB3a, under one of its addresses which is the same as the address for the same information in the second memory bank.

To increase operational security, the information read from both memory banks MB3a, MB3b of the memory bank pair during the normal operation time, is compared with each other and/or there takes place a continuous self-inspection of each of these two memory banks, for example, by way of EDC codes. If, during such examinations, an error is detected in the information read, then that memory bank, for example the memory bank MB3b, which has the error is disconnected for the length of a special operating time. For this reason, both of the memory banks of the concerned pair of memory banks can be separately disconnected, in order to block access of an access-attempting central processor, for example the aforementioned central processor CPx, to the disconnected bank, here termed the "second" bank, the memory bank MB3b, at least in order to obstruct, during this operating time, the reading from the disconnected memory bank MB3b. In this special operating time the first memory bank MB3a might be alone fully operated in the reading/writing operation so that the first memory bank MB3a alone fully maintains the reading operation and the writing operation and, therefore, the normal operation for one specific central processor, for example the central processor CPx.

The invention further utilizes an address generator which can be provided for example in the central input/output control or processor IOC1, and which, during this special operating time, can produce, systematically and one after the other, all addresses of the memory banks, at least in steps, of the memory banks MB3a, MB3b considered as examples here.

This additional aspect of the invention concerns, above all, the updating of information stored in the disconnected second memory bank MB3b, before transition is again made from the special operation to the normal operation. In accordance with the invention, the second memory bank MB3b is first, before the end of the special operating time, and therefore before the transition to the normal operating time, operated in a special manner for the realization of the information to bee stored therein.

Figure 3:
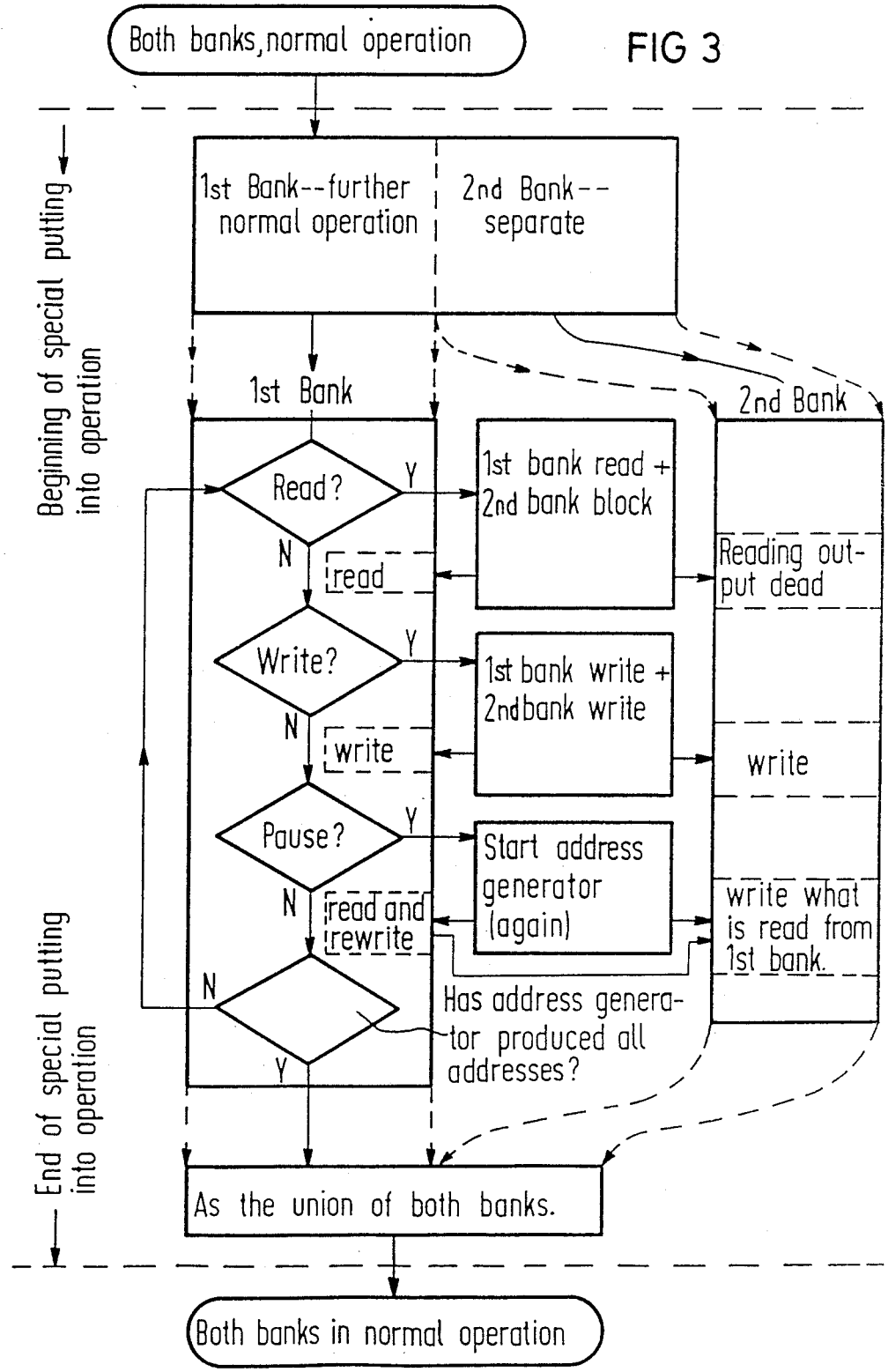
FIG. 3 is a flow chart showing an example of how the entire contents of a first memory bank, during the ongoing normal operation of the first memory bank, can be registered in a second memory bank.

This special operation is schematically illustrated in the flow chart of FIG. 3, which corresponds to this special operation. The solution of this object of the invention does not presuppose, however, that it can now be achieved by software. The solution can, despite the manner of presentation clearly set forth in FIG. 3, also be reached through hardware, therefore through a connection which operates in the same manner, or at least in a similar manner. As FIG. 3 illustrates, during reading, reading is only done from the first memory bank MB3a; however, during writing in the first memory bank MB3a, the same information as in the second memory bank MB3b, and under the same address as in the first memory bank, is written. Furthermore, for example during one or several longer delays of the read/write operation, in which neither the first memory bank MB3a is addressed nor is the information read from the first memory bank MB3a by the central processor or processors BP, CP, IOC, which are capable of access, especially for the further utilization of the central processor BP, CP, IOC, IOP, the address generator is utilized, so that the same gradually delivers addresses from among all addresses of the first memory bank MB3a and of the second memory bank MB3b to both of these memory banks, whereby the information read from the first memory bank MB3a is registered under the same address as in the second memory bank MB3b, as clearly illustrated in FIG. 3.

In this manner, the entire memory contents of the second memory bank MB3b, either again or for the first time, is realized/updated during the special operating time as soon as the address generator has delivered all addresses of the memory bank pair MB3, that is, when all information under all address is identical in both memory banks. Normal operation can now begin, either again or for the first time, that is, both memory banks while reading and while writing are again, or for the first time, operated in parallel.

With the multiprocessor special computer, which this multiprocessor central control unit represents, a random plurality of the central processors BP, CP, IOC distributed in a statistically arbitrary manner, offer, usually simultaneously, an access of the common memory CMY to the different memory bank pairs MB. Then, alternately, this is assigned to the different central processors (for example the central processors CP1, CPx, IOC0), and the bus or buses of the bus system B:CMY are assigned, so that an arbitration, via the sequence of the access, can be decided in a known manner, so that the central processor BP, CP, IOC have access to the common memory CMY/MB connected to the bus system B:CMY, either after one another or variably, both in the normal operation and in the special operation, corresponding to the arbitrations or assignments of the bus system B:CMY whereby it can also be provided that both in the normal operating time and in the special operating time, as needed, the central processor BP, CP, IOC can communicate indirectly with one another via the common memory CMY/MB.

In general, each of the central processors communicates with another area of the common memory CMY. In order to reduce the waiting times for accessing central processors, the common memory CMY includes several, in the illustrated example four, memory banks MB, each having its own memory control. This specific memory control controls its memory bank independently of the memory controls of the remaining memory banks. Therefore, these four memory banks can be simultaneously operated, both in the normal operating time and in the special operating time.

In the normal case, both buses of the bus system B:CMY operate in parallel, and process identical information. The selection is carried out by the processors BP, CP, IOC, IOP before the assignment of a time slot, in order to increase the performance of the bus system B:CMY. The priorities of the assigner can be programmable read only memory (PROM) programmable. The loading of all memory banks MB as uniformly as possible can be achieved, for example, by assigning the addresses to the memory banks MB by way of low-valued address bits, with an interleaving grid of, say, 8 bytes.

As was already mentioned above, a further multiprocessor central control unit of an exchange system having many central processors or computers operating in parallel is to be provided, which is frequently heavily loaded, and which is concerned with the most diverse operation, and ensures that the hardware expense is slight, as well as that the technical operating function should particularly be guaranteed with a very high reliability and availability. This object and the corresponding measures taken, as well as its further developments, concerns, above all, the distribution of the loads to the different central devices, regarding the different functions of the central unit, as technical exchange, operating or security functions.

This further object is achieved in that, in the central control unit, which contains a multitude of central-processors BP, CP, Which may have, but which do not require, their own individual memories LMY, and which carry out distribution technical exchange functions, and which contain a central bus system B:CMY, to which the central processors BP, CP are connected.

Only two central processors BP, which are essentially constructed in a similar manner, namely the base processors, BP, additionally carry out technical operating or security functions in such a way that:

the first base processor BP0, namely the leading of the two which is in the controlling condition, carries the technical operating and/or security functions, but, only to a portion, namely up to $x \%$ of its computing capacity, is loaded, so that it can take over further technical exchange functions up to $(100-x) \%$ of its computing capacity;

the second base processor BP1, which is in a non-controlling condition, always holds open at least $x \%$ of its capacity for possible later assumption of the control of the technical operating and/or security functions from the first, previously controlling, base processor BP0; and the second base processor BP1, therefore before the assumption of control, takes over at the most up to $(100-x) \%$ of its capacity in technical exchange functions.

It is furthermore known to continuously monitor and register the load of the processors in the most varied manner, especially if the processor or computer must execute while temporarily compartmentalized, several different programs, quasi-simultaneously.

As was already mentioned above, FIG. 1 illustrates a central control unit having two such base processors BP0, BP1, as well as ten further central processors CP0 . . . CP9, together with the bus system B:CMY. Each processor of this embodiment contains, in addition to the actual duplicated processor unit PU, a processor, specific local memory LMY which is also referred to in the art as a random access memory and a call processor memory. The base processor BP, which are essentially uniformly constructed with respect to one another, preferably carry out technical operating and/or security functions, as well as, especially under high traffic densities, additional technical exchange functions. The remaining central processors CP carry out, on the other hand, only technical exchange functions.

Both of the base processors BP carry out, however, the technical operating and/or security functions in different ways. One of the two base processors, for example, the base processor CP0, takes over the control, whereas the second base processor, in this case, therefore the base processor BP1, itself holds open its capacity, in order to possibly fully take over from the first base processor BP0 the technical operating and/or security functions as needed, so that the second base processor BP1 then fully and immediately takes over the control for all of the technical operating and/or security functions, whereby the first base processor BP0 now holds itself open for a possible later new assumption of the control of the technical operating and/or security functions. This duplication of the base processor BP is selected for security reasons, so that a flawlessly operating base processor BP is always available for the execution of these technical operating and/or security functions, especially in event of alarm, upon restarting of the exchange system after a partial or complete disconnection of the exchange system. These functions are then not left to any other random central processors CP, since, especially in cases of extreme need, not enough time exists to first select a flawless processor among the remaining central processors, especially for the restarting of the exchange system, as previously mentioned.

The execution of the technical base and security functions requires, however, not the entire capacity of the controlling base processor BP, but only x % of its capacity, even if one proceeds from the assumption that the x % of the base processor which is controlling also co-encompasses capacity reserve which, at that time, is free and unused. The controlling base processor, therefore, still has (100-x) % of its capacity fully available, despite its reserve capacity which it therefore makes available for the execution of technical exchange functions.

The amount x, therefore, the strength of the charge of the controlling base processor during the execution of the technical operating and/or security function, can be defined in at least two further different ways, which correspond to its dependence on the factor "time".

One determines the amount x from the beginning, so that x corresponds to the maximum conceivable charge of the controlling base processor BP. The residual capacity (100-x) % made available for technical exchange functions is an unchangeable amount.

It is, however, also possible to understand under x the instantaneous charging of the controlling base processor, whereby the instantaneous charging can be extraordinarily greatly smaller than the maximum charge x (max) % appearing in the worst operating case of the controlling base processor BP. In this case, the controlling base processor, as well as the other, non-controlling base processor, can in any case instantaneously make available a maximum of (100-x) % of its capacity for technical exchange functions. Since, however, in even of alarm, the need for capacity for the execution of the technical operating and/or security functions is often extraordinarily high, the charge of the controlling base processor BP, as well as the non-controlling base processor BP, with this definition of x lying at its basis, is for reasons of security always smaller than (100-x) %, since a single base processor of both of the base processors BP, namely, the one controlling base processor BP, can at any point in time, with still sufficiently high probability, fully take over by itself the entire technical operating and/or security functions.

Fundamentally, it is possible that the controlling base processor BP simultaneously carries out both the technical operating and the technical security functions, especially if a processor component of sufficient overall capacity has been selected as the base processor BP.

Especially if the extent of the technical operating and security functions overall is so great that it can scarcely be carried out by an individual base processor, especially in the case of a later expansion of the exchange system, for example from 50,000 customers to 100,000 customers within a single telephone exchange territory, it is suitable to apply two pairs of base processors BP, from which the first pair especially carries out only the technical operating functions, while the second pair especially carries out only the technical security functions, whereby in each of these pairs, one of the processors controls and at the same point in time the other processor at the time is not controlling, although its capacity to take over control correspondingly remains open. Each processor of both pairs takes over only up to (100-x) % of its capacity of technical exchange functions.

In the example illustrated in FIG. 1, only two certain base processors BP, which are equally constructed, are applied, which in addition to the technical exchange functions carry out the technical operating and/or security functions. Since both of these base processors BP exert up to a maximum (100-x) % of their computer capacity at all times, the capacities of the additional technical exchange functions are maximally utilizable for the technical exchange functions of all central processors BP, CP. The measure as specified by the present invention therefore permits especially little hardware to be applied as central processors, and, nonetheless, with very high capacities to be made available for technical exchange functions.

The technical operating and the technical security tasks which are taken care of by the base processors BP produce, considered dynamically, mostly only relatively slight loads, so that for these the load distribution for technical operating and security functions to several processors is in general not necessary. The technical exchange functions have, relative to the technical operating and security functions, considerably greater scope, so that two base processors BP are generally sufficient for a great number of central processors CP.

In the example illustrated in FIG. 1, the processors BP, CP can accordingly have an identical construction with respect to hardware, which means being constructed from completely the same chips.

The peripheral units MBG, which work directly or indirectly on the circuits of the exchange network, for example in the framework of route searching, through-switching, signaling, etc, can via the input/output controls IOP:MB . . . IOC and their local buses B:IOC, and via the central input/output processors IOC (the processors (IOC0, IOC1), and via the bus system B:CMY, be connected with various of the central processors BP, CP, which are, from case-to-case, distributed differently, and/or can also be connected with the common memory CMY or with portions of its memory banks MB. There can be carried out by these connections technical exchange communications and/or requests from peripheral units MBG, and communications and/or requests to such peripheral units MBG. The technical exchange communications and/or requests of a peripheral unit MBG are thereby autonomously distributed via the input/output unit IOP connected therewith per call, since, as already mentioned above, the specific input/output unit IOP under consideration, if it receives a call from the peripheral unit MBG, assigns at least one of the central processors BP, CP or a portion of the common memory CMY/MB to the calling peripheral unit MBG; or, through the bus system B:CMY has this assignment made. The assignment of a special central processor and/or of a special portion MBx of the common memory CMY to the peripheral units MBG (for example two peripheral units, that is one connection engages, for example, two MBG units), is then still stored in the data field, whereby this data field can also be applied within a memory bank of the common memory CMY. Through this storing in the data field, especially with cooperation of the input/output units IOP of the peripheral units MBG, all later communications and requests of the peripheral units MBG which follow this call can be transmitted through the assigned central processor BP, CP or to the same common memory bank MB, in order that the technical exchange functions, which are released by the call, can be continued there.

This autonomous assignment per call makes possible an approximately uniform charge of all central processors CP and/or BP, with technical exchange functions. At least, this assignment can be so controlled correspondingly to the instantaneous charge of the central processors BP, CP that the communications and/or requests of a technical exchange type following the call can be rapidly carried out by one of the central processors, which still has a sufficiently free capacity.

The selection and distribution of the central processors for the execution of the technical exchange functions, which are released by the call, can occur cyclically, so that with the overload of a central processor CP, BP as indicated in an overload indicator in each processor CP and BP, this processor is skipped over in the cyclical selection process. Through such a cyclical distribution of the tasks or calls on the concerned central processor, a load of the central processor can be attained which is uniform up to a certain degree. In general, all central processors quickly exhibit at least a certain partial load, but rarely a 100% load. Also, an error, or the tendency toward erroneous processing, is always rapidly sought out so that, by means of technical operating functions which are carried out by the controlling base processor BP, the processor is provisionally put out of operation, and can be skipped over during the cyclical distribution, so that a self-healing of the central control unit, possibly partial, for example by way of substitute circuits and savings, can be carried out by the memory contents.

If, as illustrated in FIG. 1, the central common memory CMY or its memory banks MB are connected to the bus system B:CMY, at least a majority of the central processors BP, CP, if not all of the central processors BP, CP, can, in accordance with the time-division multiplex principle, have access via the time slots and time channels assigned thereto by the time slot assignor, to the common memory CMY or to the individual units of its memory banks. Through this time-division multiplex operating principle of the bus system B:CMY established by the time slot assignor, longer communications between the common memory CMY and the selected processors CP, BP must not therefore be expected until another central processor CPx can, on its part, finally have access to, or record there, the data of the memory CMY. This time-division multiplex operating method is accordingly, in view of the many central processors BP, CP operating simultaneously in parallel, and which are concerned with different tasks, very advantageous to the shortening of access time to the common memory CMY. This method furthermore ensures that the storing of identical information in the processor-specific memory LMY can be restricted, so that the entire memory capacity of the common memory CMY and all processor-specific memories LMY taken together is smaller, than if only processor-specific memories LMY were utilized, so that a quasi-simultaneous access of the several central processors to the common memory is nonetheless made possible.

As has already been mentioned above, the further object of the invention is to further develop a multiprocessor computer having central processors which are simultaneously concerned with the most varied tasks, and correspondingly simultaneously carry out different processings, particularly each central processor carries out another instantaneous processing as long as it has not inserted a delay, so that:

. on the one hand, hardware expense is slight; and on the other hand, the time expense for an access of a central processor to the common memory is as small as possible, and a quasi-simultaneous access is thereby made possible, in which several central processors can have access to the common memory, via an individual bus system, without reciprocal obstruction.

The above object is achieved so that, in the multiprocessor computer comprising a bus system B:CMY to which the central processors BP, IOC are connected, and which variably are assigned to the various of the central processors (for example, CP CPx, IOCO), and a common memory CMY connected to the bus system B:CMY, including several memory banks MB, which are operated, possibly duplicated, in parallel, and memory bank pairs, to which the central processors BP, CP IOC variably have access, via the bus system B:CMY, corresponding to the assignments of the bus system B:CMY, and through which, as needed, central processors BP, CP, IOC, can communicate with one another, it is provided that:

the common member CMY contains several memory banks or pairs of memory banks MB, each with its own memory control, which controls its own memory bank MB independently of the memory control of the remaining memory banks MB;

on the bus, or the buses, of the bus system B:CMY, time frames with time slots or time channels are arranged, in accordance with the time-division multiplex principle; one or several of the time channels are firmly assigned to each memory control; and several of the central processors BP, CP, IOC can be assigned to the quasi-simultaneous access to the different memory banks MB, time slots or time channels 0, 1, 2, 3.

This aspect of the invention is explained in greater detail in an exemplary embodiment which is illustrated in FIGS. 1 and 4.

In such a multiprocessor computer, which represents the multiprocessor central control unit illustrated in FIG. 1, a selected number of the central processors BP, CP, IOC distributed statistically arbitrarily, normally simultaneously requires an access to the common memory CMY or to different memory banks MB as described above, mostly operating in pairs and in parallel. Then the bus system B:CMY is variably assigned to these different central processors (for example, CP1, CPx, IOCO), whereby an arbitration or assignment via the sequence of the accesses can be determined in a well known manner, so that the concerned processors BP, CP, IOC can have access to the common memory CMY connected to the bus system B:CMY, or, more accurately, to its individual memory banks MB, either sequentially or variably, corresponding to the arbitrations or assignments of the bus system B:CMY. The central processors BP, CP, IOC can therefore, as needed, also communicate with each other indirectly, via the common memory CMY, MB.

In general, each of these access-willing and/or summoned central processors communicates indirectly with another memory bank or memory bank pair MB of the common memory. In order to reduce the waiting times of the central processors, the common memory CMY contains several, four in the depicted example, memory bank pairs MB each having its own memory controls. The specific memory control independently controls its memory bank MB with respect to the memory controls of the remaining memory banks MB. These four memory bank pairs are preferably operated simultaneously.

In accordance with the time-division multiplex principle, time frames having time slots or time channels are set up on the bus system B:CMY, (in the present example, four time channels 0-3, as seen in FIG. 4), so that there is firmly assigned one or possibly, in other examples, several, time channels to each memory control, and whereby time slots or time channels forming, possibly duplicated, a pair operating in parallel (see time slots 0-3) can be assigned to the central processors BP, CP, IOC, demanding a communication to quasi-simultaneous access to the different memory banks MB, to a time frame. In this aspect of the invention, therefore, a number of central processors BP, CP, IOC, if not all of the central processors, which correspond to the number of time slots which can be assigned per time frame, can, in accordance with the time-division multiplex principle, have quasi-simultaneous access to the common memory CMY or to its memory banks. In principle, several time slots could also be assigned or allotted to each memory bank MB and/or to each communicating central processor BP, CP, IOC, according to time frame; compare the time frame in FIG. 4 as an example.

Through this technique, the length of the assigned time slot, for example the time slot 1, can be much shorter than the length of a memory cycle, as illustrated for the frame Px. Therefore, in this example, only a single bus system B:CMY is employed, to which, however, the information flows quasi-simultaneously; that is, it is greatly condensed, which contributes to a reduction of the hardware expense for the bus system, in comparison with a bus system per memory bank MB. Through this time-division multiplex method of operation of the bus system B:CMY, longer lengths for communications must not be expected between the common memory CMY and a first selected one of the central processors BP, CP, IOC, until another, second random central processor PBx, CPx, IOCx, for its part can finally have access to the data of the memory CMY, or deposit data there. This time-division multiplex method of operation is accordingly, in view of the many central processors BP, CP, IOC, operating simultaneously in parallel, and concerned with different individual tasks, very advantageous for the shortening of the access time to the common memory CMY. It is particularly advantageous that the common memory CMY, despite this rapid simultaneous access possibility, must have a number of memory controls or decoders operating independently of one another, operating, often extremely slowly, in comparison with the time slot length, so that such a very slow memory control, individually and transiently, needs to be assigned or allotted to one of the central processors in a time slot for a comparatively very short time.

The writing cycles can accordingly, after the acceptance of the information in the processor bus system, be autonomously passed on by the bus system B:CMY. An immediate receipt at the communicating central processor makes possible its immediate further start, although the transmission of the writing cycle to the memory bank MB is still not excluded. This makes possible an especially high capacity or processing speed of these variants of the multiprocessor computer.

Reading cycles can be carried out especially rapidly, if on the one hand, the multiwired, especially duplicated, address transmission bus lines of the bus system B:CMY to the common memory CMY, and on the other hand, the multiwired, especially duplicated, memory contents transmission bus lines of the bus system B:CMY from the common memory, can be controlled independently of one another and in such a way that:

in a first time slot (for example, the time slot 0 in the frame Px+1 of FIG. 4), a first address for reading and/or writing processes from a first (for example, CP0) of the central processors can be transmitted to the address transmission bus lines, to the common memory CMY or its memory banks or memory bank pair MB; and at the same time, thus in the first time slot (therefore: the time slot 0 in the frame Px+1), a memory content which has been previously read, and which belongs to another of two addresses transmitted (for example, at the time slot 0 in the frame Px), can be transmitted to the first central processor (CP0) or the other central processor (for example, the central processor IOC0) to the memory contents transmission bus lines from the common memory CMY, or its memory bank or memory bank pairs MB.

Through this technique, the flow of addresses and information to the bus system B:CMY is particularly greatly intensified, and an especially high processing capacity and processing speed of the multiprocessor computer is attained, namely since the reading cycles extend to a memory bank MB which is so compartmentalized, that the retransfer of the data read occurs simultaneously with the transmission of the addresses for a following reading access, or for a still later reading access.

The reading cycles are therefore distributed, in this variation, for (at least) two time frames, instead of in one time frame. The writing cycles run in a different manner. The writing cycles preferably engage only one time slot in a single time frame, in which the address and the writing information is simultaneously transmitted via the bus lines. During the reading cycles, therefore, two time slots, separated through the length of a single time-division multiplex time frame are engaged. The first time slot is for the transmission of the reading address which starts the relatively slowly operating memory control or address coding, and the following time slot, which, because of the slowness of the memory control, lies in a later time frame, is for the retransmission of the information read out of the memory bank MB. To reduce expense and to increase throughput, the address and data paths and their corresponding lines are correspondingly independently controllable, so that simultaneously, for the retransmission of the information read to a chosen central processor, the carrying over of a following reading address is possible in one and the same time slot, compare the time slot 0 in the frame Px and in the frame Px+1, from the same or from another central processor. This cycle formation is particularly advantageous, since in many multiprocessor computer uses, the reading cycles are more than twice as frequent as the writing cycles.

To reduce expense, the access arbitration for the assignment of a time slot is carried out in a time slot to a requesting central processor BP, CP, IOC, and to be sure, for the production of a high cycle throughput, and then in the running time slot or in one of the time slots lying shortly before the running time slot.

Compared with an access system, which would connect the central processors via independent buses to the individual memories, it is possible, with this feature of the invention, to reduce the switching expense approximately to almost $1/n^{th}$ with n time slots per time frame.

These described features of the time slot utilization are, moreover, fully compatible with the action which is already in the local, processor-specific memory LMY, for the central processor program course, for the purpose of reducing the access to the common memory CMY which stores away dynamically important codes and local data, which further increases the processing speed of the multiprocessor control computer. In one of the examples developed in accordance with FIG. 1, Siemens AG SAB 80286 microprocessors were employed for a central processor CP, as previously mentioned, which each have access via a physical address space of 16 MByte, whereby the central processors were duplicated for the improvement of error recognition, and each were disconnectable in pairs. The processor pairs operated synchronously. During writing cycles, the signals were always taken from a controlling, thus preferred, processor of the central processor pair during reading cycles; however, both processors of the central processor pair were simultaneously taken care of through the same time slot. Communication between the central processors occurs via the bus system B:CMY, via arbiters, by setting priorities, so that the data exchange between the input/output units IOP and the processors CP occurred in this example through the common memory CMY. The priorities of the arbiter are hereby PROM-programmable. A charging of all memory banks MB as uniformly as possible can be attained, for example, through the assignment of the addresses to these memory banks via low-value address bits, on an interleaving grid of, for example, 8 bytes.

Although these variations of the last-described feature of the invention, only one duplicated central bus system, and not several independent bus systems, is utilized with several central processors and several parallel-operating central memory banks, and so quasi-simultaneous memory accesses from the most varied central processors can be executed to different central memory banks. The four memory bank pairs MB0 . . . MB3 and their memory controls were so assigned to the four time slots, that each time slot was firmly assigned to one of the four memory bank pairs MB or their memory controls. This proved to be a favorable, comparatively simple construction and, as previously mentioned, sufficient for a telephone exchange system having a number of tens of thousands customers. At any rate, if the time slots assigned cyclically one after another to the memory controls were assigned by way of priority-setting arbitration, each maximally simultaneous to four central access-willing processors, if the cycle frequency of the time slots was, at the most, higher by "T"-fold, then the highest permissible memory cycle frequency of the memory controls conditioned by the memory construction, where "T" is the number of the memory banks or memory bank pairs MB of the common memory, here four. This rule also applies if "T" is smaller or larger than four. If only three (or ten) memory bank pairs are connected, just three (ten) time slots are required per time frame (see the frame Px in FIG. 4) in the most simple example, if the length of the time frame is approximately just as large, or slightly larger, than the length of a memory cycle. In the most simple example, the number n of the time slots can be determined by the transfer length ti of information and by the cycle time ts of a memory, in accordance with the relationship of $$n = {t_s}/{t_i}$$

in an information referral to the bus system having 8 MHz, and a memory cycle frequency of 2 MHz, there is then provided (see FIG. 4) four time slots per time frame, through which the memory cycles, temporarily shifted by 125 ns, can be started or ended in the different memories. From the length of the time slots, in this example 125 ns, the maximal length of the bus lines, for example 3 m is calculated also, and one would prefer to keep the build-up effect on the bus system small.

Depending on the operating method of the bus system or the memory access, there must be one, but in other operating modes, several bus system B:CMY time slots engaged for an access to a, possibly duplicated, memory bank. If several, namely x time slots are assigned per time frame to a memory bank, the time slot cycle frequency can correspondingly amount to more than just the T-fold, for example, to a xT-fold, of the memory cycle frequency, if the length of time frame is approximately equal to the memory cycle time.

The detail of the invention illustrated in the following was developed to control the disconnection of an error-afflicted processor pair and to control the substitute through another processor pair in the multiprocessor central control unit of a telephone exchange system. This further feature of the invention is also suited, however, for duplicated circuits having synchronous parallel operation.

The object of this further feature is to so-develop a test device operating n accordance with the EDC-code that:

on the one hand, the hardware expense is slight; and on the other hand, the security and reliability of the error recognition is very high.

This object is solved in that in a testing device for error recognition and duplicated circuits CP operating in parallel and delivering binary signals, for example, central microprocessors CP of the multiprocessor central control unit of a telephone exchange system, having at least one parity network producing test bits from the binary signals per circuit CP, multi-wired output circuits Li, Ledc for the binary signals and test bits of the circuits CP, which are connected with one or several receiver units (for example, central common memory CMY) receiving the binary signals and test bits, and comparator devices VE which bit-wise inspect the identity of bits on the output circuits Ledc of both circuits CP corresponding to one another, it is provided that:

the circuits CP which contain an error detection and correction circuit EDC0, EDC1 having its own parity networks, whereby the conductors of the circuit CP delivering the binary signals are each connected to the inputs of the EDC circuits EDC0, EDC1;

both EDC circuits EDC0, EDC1, by means of their parity networks, each produce an EDC code as test bits of the binary signals of the concerned circuits CP, and only the output circuit Ledc for the test bits of both EDC circuits EDCp, EDC1, but no longer the output circuits Li passing on the output bits for the binary signals of the circuits CP, are connected with the comparator devices VE for bit-wise inspection of the EDC code of both EDC circuits EDC0, EDC1, but no longer for the bit-wise inspection of the binary signals of both circuits CP.

Figure 5:
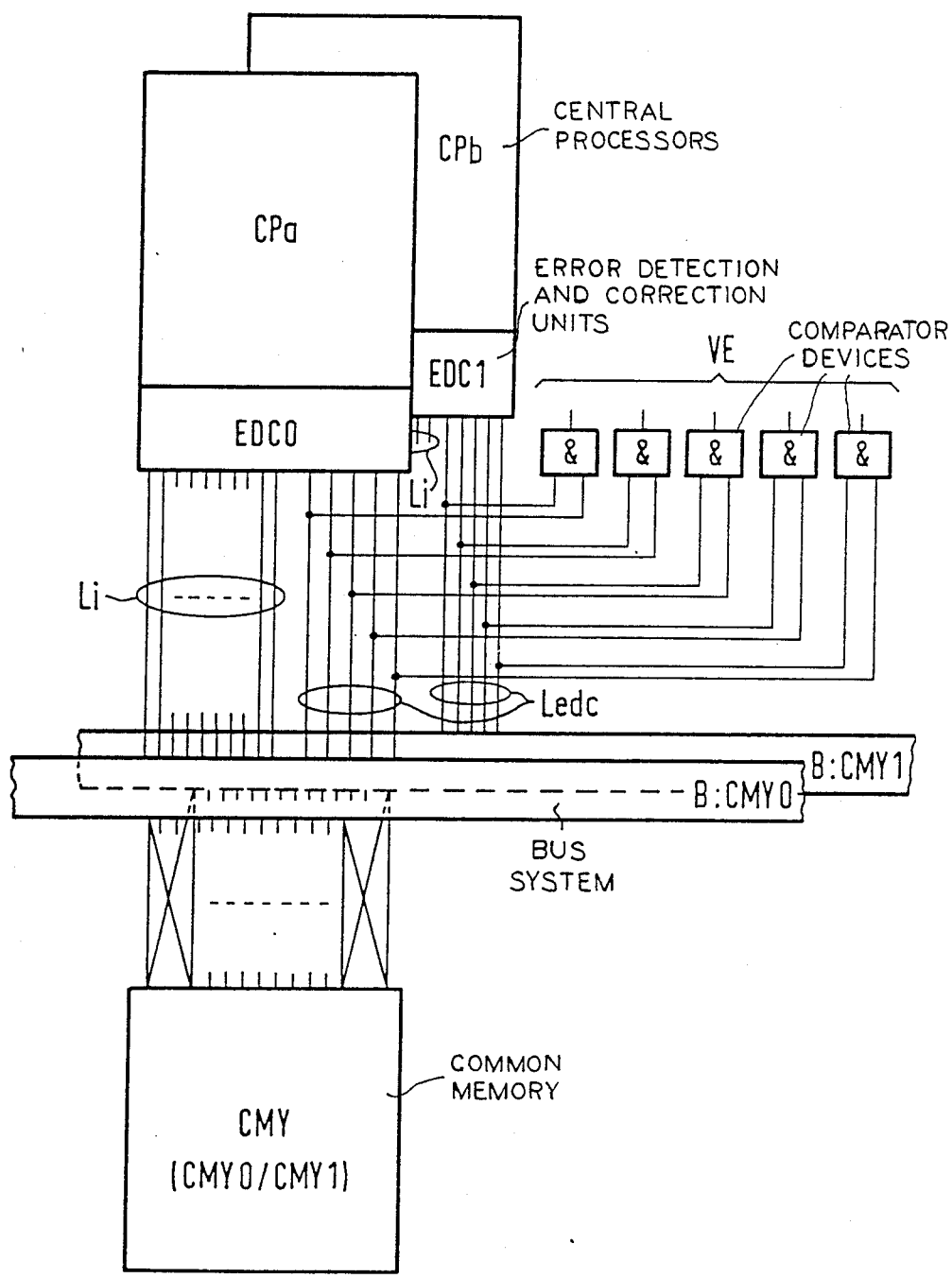
FIG. 5 is a schematic representation of further details of the central control unit of FIG. 1, shown in order to illustrate a special type of error detection and correction testing.

This feature of the invention is illustrated in greater detail by an exemplary embodiment shown in FIG. 5, and in which the circuit is a central processor BP or CP or IOC illustrated in FIG. 1.

FIG. 5 therefore illustrates individual details of the microprocessor central control unit of FIG. 1 in which the central processors BP, CP IOC cooperate with the common memory CMY via the bus system B:CMY. As was already mentioned above, and not shown in FIG. 1 for reasons of simplicity and clarity, each central processor BP, CP, IOC shown in FIG. 1 can be duplicated for increasing the availability of the central control unit. Such a duplication is presupposed in FIG. 5. In the example shown in FIG. 5, not only is the central processor CP shown (compare for example, the processor CP1 in FIG. 1 with the corresponding pair CPa, CPb, in FIG. 5), but in addition, the bus system B:CMY (compare CPb and B:CMY0, B:CMY1 of FIG. 5), is preferably also the receiver unit CMY; that is, the common memory CMY (see CMY0, CMY1), both twin halves can be reached for both central processors CPa, CPb and the bus system B:CMY, as shown at the circuit crossings. Both of the central processors CPa, CPb, preferably constructed essentially in connection with one another, carry out, at least if sufficient connection demands are present, simultaneous or quasi-simultaneous technical exchange, security, and/or operating functions. Each of these central processors (CPa, CPb) can also still contain its own processor-specific local memory (memory LMY in FIG. 1) in order to be temporally independent of the common memory CMY, for example in its own LMY-RAM part for a few data and program steps, which it carries out or processes at that time, and, for example, in its additional own LMY-ROM part, for frequently used program steps.

As shown in FIG. 5, it is therefore a matter of a test device for error recognition of the duplicated circuits operating in parallel and delivering binary signals, namely, cited here as an example, the central processors CPa, CPb of the central control unit of a telephone exchange system. Each test device contains a number of parity networks which produce test bits from the binary signals of the circuits/processors CPa, CPb per circuit/processor (CP), whereby these parity networks can be completely contained, in the EDC circuits EDC0, EDC1, for example, of the circuits/processors CP, and so that the lines of the circuits/processors CPa, CPb which supply the binary signals are each connected with the inputs of the EDC circuits EDC0, EDC1. As EDC circuits, reference may be taken to commercial components sold under the designation Am 2960 and the German published application 33 19 710 mentioned above. Both EDC circuits EDC0, EDC1 by means of their parity networks produce an EDC code as test bits of the binary signals of the circuits/processors CPa or CPb connected thereto.

There are two kinds of multi-wired output lines Li, Ledc, of each of both EDC circuits/processors, namely the output lines Li for the binary signals, and therefore for output information and/or addresses for the central common memory CMY delivered from the processors CPa, CPb, and the output lines Ledc for the test bits of the EDC circuits EDC0, EDC1 of the processors CPa, CPb. The binary signals on the output lines Li are in general identical with the binary signals emitted by the processors CPa, CPb, and therefore unchanged by the EDC circuits. If a bit of binary signal on the lines li from the pertinent EDC circuit can be recognized as false, but correctable, this false bit of the EDC circuit EDC0 or EDC1 is replaced by the correct bit. The central common memory CMY obtains, via the bus system B:CMY, the binary signals transmitted via the output lines Li, as well as the test bits transmitted via the output lines Ledc. Here reference is taken to a special use example for memory addressing secured by test bits in the above-mentioned German published application No. 33 19 710.

The test device illustrated in FIG. 5 contains, furthermore, several, five, comparators VE, which bitwise compare the identity of test bits on the output lines Ledc of both EDC circuits EDC1, EDC1. Only the output lines Ledc for the test bits of both EDC circuits (however no longer the output lines Li for the binary signals) which are connected with the comparator VE formed by AND gates, for the bit-wise inspection of the EDC code or the test bits of both EDC circuits. A bit-wise inspection of the binary signals of both processors CPa, CPb therefore no longer takes place in the example of FIG. 5. This means a substantial saving of hardware for the comparators VE in comparison with a bit-wise inspection of the entire binary signals, all the more so with a bit-wise inspection of both the entire binary signals and the entire test bit. The test bits are, in particular such a reliable reflection of the binary signal, that even simple errors of the binary signal are automatically correctable. therefore, in the test device as specified by the present invention, in which the direct bit-wise inspection of the binary signal by the comparators is missing, but only the direct bit-wise inspection of the test bits by the comparators VE takes place, despite the considerable mounting of hardware, in a great number of cases, as in a telephone exchange system, is fully and sufficiently reliable to immediately recognize errors in the binary signals of one of the two processors CPa, CPb, in order to be able to meet, for example, the test programs for these processors CPa, CPb, and/or, for example, in order to be able to separate these processors CPa, CPb entirely from the bus system B:CMY especially if the comparators VE is connected with the output lines Ledc between the EDC circuits EDC0, EDC1 of the central processors CPa, CPb and the busy system B:CMY this processor pair CPa, CPb can be separated rapidly from the bus system B:CMY; in principle, even before the busy system B:CMY begins the receipt or non-receipt of the binary signals and of the test bits.

Especially in the multiprocessor central control unit of a particularly large telephone system, each individual processing step necessary for a connection lasts only briefly, often only one or a few cycles long, whereby, however, a high number of technical exchange functions to be carried out simultaneously or quasi-simultaneously for a high number of connections are to be carried out frequently as, for example, the monitoring of customers of all connections created by picking-up receivers and selecting call numbers, route searches, route through-switchings, signal tones, fee determination, announcements, facilities of the most varied type, hanging up by the customers, etc.

A special feature of the invention is the improvement of a multiprocessor central control unit with a central bus, to which the central processors as well as a central common memory are connected, whereby the central processors can simultaneously be concerned with the most varied special tasks, and then correspondingly simultaneously carry out different processings, whereby, for example, each central processor carries out another instantaneous processing, insofar as it does not insert a delay, specifically to so improve it, that:

on the one hand, the hardware expense is slight; on the other hand, the entire length of engagement of the common memory, through the access of a central processor to the common memory, is as slight as possible; and in general, no or only one processing connection is disrupted by the failure of an individual central processor, so that the disturbance is slight, apart from possible special cases, in which one processor works on several connections, for example, in which it alters generally valid data in the common memory.

In principle, these central processors can hereby be a simple processor or duplicated processors.

The above object is achieved in that, in a multiprocessor central unit of an exchange system, for example, a telephone exchange system, having a central bus system B:CMY to which the central processors BP, CP, IOC which have their own local memory LMY are connected, and which, one after another are assigned to different ones of a central processor (for example, CP1, CPx IOC), and a common memory CMY connected to the bus system B:CMY to which the processors BP, CP, IOC have access, via the bus system B:CMY, one after another and corresponding to the assignments of the bus system, it is provided that:

for the execution of at least all frequent technical exchange functions related to special connections of exchange system customers, for example, route searching, throughswitching, fee determination, signal tone control, call number acceptance and coding, connection path separation, etc.;

the local memories LMY of all such central processors CP, which in general, during the entire length of its operation, have to control, at least substantially, the same catalog of tasks/processing steps, preferably in a ROM part of the local memory LMY, and continuously store corresponding identical program sections required most frequently, and/or needed most urgently during disruptions, from the central processor CP, as well as preferably in a RAM part of the local memory LMY temporarily still store such non-identical data which are especially necessary for a sole connection of two chosen exchange system customers to the processing step of that time, for example, to route searching, and the common memory CMY, in addition to rarely-needed program sections, still stores data concerning a great number of connections at the time.

As has already been described, the central processors BP, CP, IOC are equally constructed, preferably in connection with one another, and simultaneously carry out, at least as long as satisfactory connection requirements are present, technical exchange functions as well as, at least the processors BP, technical security and/or operational functions. Each central processor BP, CP, IOC contains, in addition to the actual duplicated processor PU, preferably a RAM part of the processor-specific local memory LMY, especially for data which the central processor requires for the processing of a special technical exchange function for a connection between two selected exchange system customers. Even the input/output processors IOC can each have such of their own memory LMY, as illustrated in FIG. 1. The data in the RAM part can also be recalled from the common memory CMY. Furthermore, the local memory LMY preferably in a ROM part, contains the program sections required most frequently/urgently by the central processor. Since many of the central processors, considered in general for the length of their operation, must process an identical or substantially identical catalog of tasks, for example, but be able to independently solve all possibly-occurring technical exchange tasks, and their local memories LMY, at least partially, store identical program sections, therefore preferably in a ROM part of their specific memory LMY. They preferably there store those program sections which, in event of disturbance, are required for starting and for error recognition of the central processor, so that this central processor, in case of disruption, does not first require time-consuming access to the common memory CMY.

In the event of the failure of a central processor or central processor pair BP, CP, IOC, all connections which at that time were processed by the processor concerned were endangered or disturbed. The program sections which are most important for their dynamic functions are stored in their local processor-specific memory LMY along with the local data important for carrying out the processing steps. In order to make dangers or disruptions as minor as possible, the local memory LMY of the concerned central processor BP, CP, IOC, which controls the processing step being carried out at the time, for each connection, in general or always, stores only such data as is specifically necessary for this single connection of two random exchange system customers, to the processing step being carried out at the time, for example, for route searching, whereby the common memory stores all, or all other data for a great number of connections at that time, preferably for all connections. The local memory LMY therefore stores, for the execution of all technical exchange functions related to special connections of exchange system customers (for example, route searchings, through switching, fee determination, signal tone control, call number acceptance and coding, connection route assembly, etc.) only the necessary data for one connection, which it immediately processes. If the central processor concerned actually fails, then, at most, this single connection which has been processed is disturbed, but not all the remaining connections. In the distribution of tasks to the different central processors having their own local memories LMY, the failed central processor can then be skipped over long enough for a substitute to be created therefor or for it to be adjusted.

If one, in addition, also stores away data in the local memories LMY, in the common memory CMY, then one can, in principle, register this data in such a failure from the common memory CMY in the local memory LMY of another central processor BP, CP, IOC, through which, at least frequently, the processed connection, despite its failure, can subsequently be processed.

If the central processor PB, CP, IOC is duplicated, and therefore actually represents a processor pair, then for both of these processors, a single local memory LMY common to both of the processors is also utilized, through which the expense for hardware also decreases. If this local memory LMY once becomes defective, then the entire processor pair can be separated from the bus system B:CMY or skipped over at the request of the processor, if the error cannot automatically be repaired.

Although we have described our invention by reference to particular illustrated embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a process for operating a multicomputer control computer including a residual portion, for example, for the central control unit of a telephone exchange system, and which comprises a plurality of central processors, a duplicated common memory including a plurality of pairs of memory banks, a duplicated central bus system including first and second central buses, a plurality of first switches for selectively connecting the central processors to the buses of said bus system, and a plurality of second switches for selectively connecting said memory banks to said buses of said duplicated central bus system, and in which the central processors operate in accordance with normal operating programs for controlling exchange functions, and in which some of the central processors are redundant processors, the improvement therein comprising the steps of:

in order to disconnect, during a special operating time, redundant parts of the control computer and to interconnect an independent special computer without disturbing the normal operation of the remaining, residual portion of the control computer, operating said first and second pluralities of switches to interconnect individual redundant central processors, one of said buses, at least one of said memory banks and the independent special computer for a special program for the preparation of a modification of the normal operating program of the control computer;

operating the remaining portion of the computer in accordance with the normal operating program runs via the other bus during the special operating time; and terminating the special program of the special computer no later than an overload time of the residual portion of the control computer by reconnecting the special computer to the residual portions of the control computer so that the redundant portions may operate with a modified normal operating program.

2. In a process for operating a pair of memory banks which are connected in parallel during a normal operation time and which includes first and second memory banks of a memory of a processor control unit, in which at least one processor, in a read/write operation, reads from and writes into the first and second memory banks during a normal operating time so that said first memory bank stores the same information under one of its addresses as the second memory bank does under the same address, in which there is a micro-synchronous comparison of the information read from both memory banks during the operating time with a continuous comparison of the information in each memory bank with error detection codes, in which the first and second memory banks may be disconnected from parallel operation, and in which an address generator produces all addresses during a special operating time, systematically one after another in steps, the improvement therein comprising the steps of:

disconnecting the second memory bank, in a special operating time during reading from said memory banks while operating the first memory bank to alone fully maintain the reading operation and the writing operation;

before the end of the special operating time and transition to the normal operating time for updating the information to be stored in the second memory bank, transferring information from the first memory bank under the same address to the second memory bank;

during at least one pause of a read/write operation in which neither of the memory banks is written into or read from by the processor for evaluation of the information by the processor, producing addresses of the memory locations of the first and second memory banks so that the information read from the first memory bank is recorded under the same address in the second memory bank; and thereafter, producing all addresses in both memory banks so that the information stored in both memory banks is the same for beginning the normal operating time and reconnecting the second memory bank for operation of the first and second memory banks in parallel.

3. A central control unit of an exchange system, for example a telephone exchange system, comprising:

a plurality of central processors each operating in accordance with programs for carrying out distributed technical exchange functions;

a central bus system connected to said plurality of processors;

two specific central processors as first and second base processors operating in accordance with programs for carrying out technical operating and/or security functions;

a first of said base processors being a controlling one of the two base processors and operating to carry out the technical operating and/or security functions alone and loaded to a level of x % of its computing capacity so that it can take over additional technical exchange functions up to (100-x) %;

said second base processor always maintaining at leas x % of its capacity for possible later assumption of the control of the technical operating and/or security functions of the first base processor; and said second base processor, before assuming control, taking over, at the maximum, (100-x) % of its capacity of technical exchange functions.

4. A central control unit, according to claim 3, and further comprising:

a common memory, said common memory connected to said central bus system;

a plurality of input and output conductors for the exchange system;

a plurality of peripheral units connected to said input and output conductors for distributive connection to the central processors and the common memory for communications therewith;

a plurality of input/output controls connected to said plurality of peripheral units and operable to selectively connect the same to said central processors and/or said common memory via said central bus system;

each of said input/output controls operating, in response to a call, to cause said central bus system to assign an associated calling peripheral unit, at least one of the central processors and/or at least a memory bank of said common memory and to store the assignment in a memory so that, by way of the particular input/output control, all communications and/or requests of the peripheral unit are transmitted to the same central processor and/or to the same memory bank.

5. A central control unit according to claim 4, and further comprising:
   means for selecting the central processors for the execution of technical exchange functions on a cyclical basis; and
   means for skipping a central processor in the cyclical selection process in response to overloading of that central processor.

6. A central control unit according to claim 4, and further comprising:
   means for said central bus system operable in accordance with the time-division multiplex principle to assign time slots in buses of said central bus system to a plurality of said central processors so that the same has quasi-simultaneous access to said common memory.

7. A central control unit according to claim 6, and further including:
   means for said central bus system for assigning time slots in buses of said central bus system to certain of said memory banks for quasi-simultaneous access of said common memory.

8. In a multi-processor computer, particularly a multiprocessor central control unit of a telephone exchange system, in which a bus system, to which a plurality of central processors are connected and in which the bus system is variably assigned to various of the central processors, and in which a common memory is connected to the bus system and includes a plurality of memory banks and a plurality of respective memory bank controls which operate independently of one another with each memory bank being variably accessed by the central processors via the bus system and corresponding to assignments of the bus system, and which common memory, as required, can provide communications between the central processors, the improvement wherein:
   each of said memory banks comprises a respective one of said memory bank controls operable independently of corresponding ones of said memory bank controls of the other memory banks;
   on the central bus system, means provide time frames including time slots for operation in accordance with the time-division multiplex principle;
   at least one of the time slots being permanently assigned to one of the memory bank controls of the memory banks during a predetermined number of time frames; and
   means are provided operable to assign a plurality of the central processors to substantially simultaneously access the different memory banks via the at least one permanently assigned time slot.

9. The multi-processor computer improvement of claim 8, and further defined that:
   an individual time slot is permanently assigned to each memory control;
   means are provided for assigning time slots cyclically one after another by way of arbitration to central processors calling for access to the memory banks to which the central processors are assigned; and
   means provide that the cycle frequency of the time slots is higher than a memory cycle frequency of the memory controls by a multiple T at the outside, where T is the number of independent parallel operating memory banks of the common memory.

10. The multi-processor computer improvement of claim 9, wherein: a plurality of conductors form address transmission bus lines of said bus system to said common memory;
   said bus system comprises a plurality of data transmission bus lines extending from said common memory;
   in a first time slot, a first address for reading or writing can be transmitted from a first of the central processors on the address transmission bus lines to said common memory; and
   at the same time, and for independent control, in the first time slot a memory content which is read, and which belongs to a previously transmitted address, is transmitted to the first central processor or to another central processor on the data transmission bus lines from the common memory.

11. In a testing device for error recognition in duplicated circuits operating in parallel and delivering binary signals, for example central microprocessors of a control unit of a telephone exchange, the improvement therein comprising:
   at least one parity network per circuit operable to produce testing bits from the binary signals;
   a plurality of output lines for the binary signals and a plurality of output lines for the testing bits of each of the parallel duplicated circuits;
   a receiver connected to said binary signal output lines to receive the binary signals and to said testing bits output lines to receive the testing bits;
   a plurality of comparator devices which, in a bit-wise manner, inspect the identity of only the testing bits, on the output lines for the testing bits corresponding to one another, of the circuits;
   said plurality of output lines for the binary signals of each of said circuits connected to input lines of the parity network of the respective circuit and operable to produce, at the parity network, an error detection code as testing bits for the binary signals of the circuits; and
   said output lines for said testing bits alone connected to said comparator devices for the inspection in a bit-wise manner of the error detection code.

12. The testing device improvement according to claim 11, and further defined as including:
   a multiprocessor computer including duplicated processors as said circuits;
   a multiconductor bus system as a receiver which is connected to said output lines of said circuits; and wherein
   said comparator devices are connected to said output lines of said testing bits.

13. In a multiprocessor central control unit of an exchange system, for example a telephone exchange system, in which a central bus system, to which a plurality of central processors each having their own local memory are connected, and to which, one after another, different units of the central processors are assigned, and in which a common memory is connected to the bus system to which the central processors have access in succession via the bus system corresponding to the assignments of the bus system, the improvement wherein:

for the execution of at least all frequent technical exchange functions the local memory of each central processor comprises a read only memory which is operable, during the entire length of an operation to control the frequent technical exchange function for always storing all the program sections needed most frequently and more urgently during disruptions of the respective central processor and a random access memory for occasionally storing non-identical data which are particularly necessary for a connection of exchange system customers to the processing step at that time; and said common memory includes means for storing data relating to a great many connections in use at the same time.

* * * * *